US012622050B2

(12) United States Patent
Lin et al.

(10) Patent No.: US 12,622,050 B2
(45) Date of Patent: May 5, 2026

(54) INTEGRATED CIRCUIT AND MANUFACTURING METHOD THEREOF

(71) Applicant: Taiwan Semiconductor Manufacturing Company, Ltd., Hsinchu (TW)

(72) Inventors: Meng-Yu Lin, Hsinchu (TW); Chun-Fu Cheng, Hsinchu (TW); Hsiang-Hung Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 621 days.

(21) Appl. No.: 18/099,503

(22) Filed: Jan. 20, 2023

(65) Prior Publication Data

US 2024/0186323 A1    Jun. 6, 2024

Related U.S. Application Data

(60) Provisional application No. 63/430,439, filed on Dec. 6, 2022.

(51) Int. Cl.
| | |
|---|---|
| *H10D 84/85* | (2025.01) |
| *H01L 23/528* | (2006.01) |
| *H10D 84/01* | (2025.01) |
| *H10D 84/03* | (2025.01) |

(52) U.S. Cl.
CPC ......... *H10D 84/85* (2025.01); *H01L 23/5283* (2013.01); *H10D 84/0186* (2025.01); *H10D 84/038* (2025.01)

(58) Field of Classification Search
CPC .. H10D 84/85; H10D 84/0186; H10D 84/038; H01L 23/5283
See application file for complete search history.

(56) References Cited

U.S. PATENT DOCUMENTS

| | | | |
|---|---|---|---|
| 2021/0408285 A1* | 12/2021 | Hickey | H10D 64/017 |
| 2022/0399445 A1* | 12/2022 | Guler | H10D 62/118 |
| 2023/0377998 A1* | 11/2023 | Smith | H01L 23/5286 |

* cited by examiner

*Primary Examiner* — Christine A Enad
(74) *Attorney, Agent, or Firm* — Birch, Stewart, Kolasch & Birch, LLP

(57) ABSTRACT

An integrated circuit includes a plurality of transistors and a vertical local interconnection. The transistors include a plurality of gate components, a plurality of front-side source/drain epitaxies and a plurality of back-side source/drain epitaxies, wherein the front-side source/drain epitaxies are closer to a front-side of the integrated circuit than the back-side source/drain epitaxies. The vertical local interconnection connects a first connected-one of the front-side source/drain epitaxies with a second connected-one of the back-side source/drain epitaxies. A covered-one of the gate components is located between the first connected-one and the second connected-one, the covered-one comprises an front-side portion, a back-side portion and a covered portion connecting the front-side portion with the back-side portion, and the vertical local interconnection crosses the covered portion and exposes the front-side portion and the back-side portion.

20 Claims, 44 Drawing Sheets $111\begin{cases}111A \\ 111B \\ 111C \begin{cases}111C1 \\ 111C2 \\ 111C3\end{cases} \\ 111D\end{cases}$    $112\begin{cases}112AB \\ 112AC \\ 112B \\ 112CD \\ 112D\end{cases}$    $113\begin{cases}113AB \\ 113AC \\ 113B \\ 113CD \\ 113D\end{cases}$ 170r2

171

172

120

233r

280'

233r

280'

220'

280'

INTEGRATED CIRCUIT AND MANUFACTURING METHOD THEREOF

PRIORITY CLAIM AND CROSS-REFERENCE

This application claims the benefit of U.S. provisional application Ser. No. 63/430,439, filed Dec. 6, 2022, the subject matter of which is incorporated herein by reference.

BACKGROUND

An integrated circuit is an electronic component that utilizes the electronic properties of semiconductor materials to affect electrons or their associated fields. One widely used type of integrated circuit is the field-effect transistor (FET). However, parasitic impedance may exist in these semiconductor materials and it will negatively affect the performance of the integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
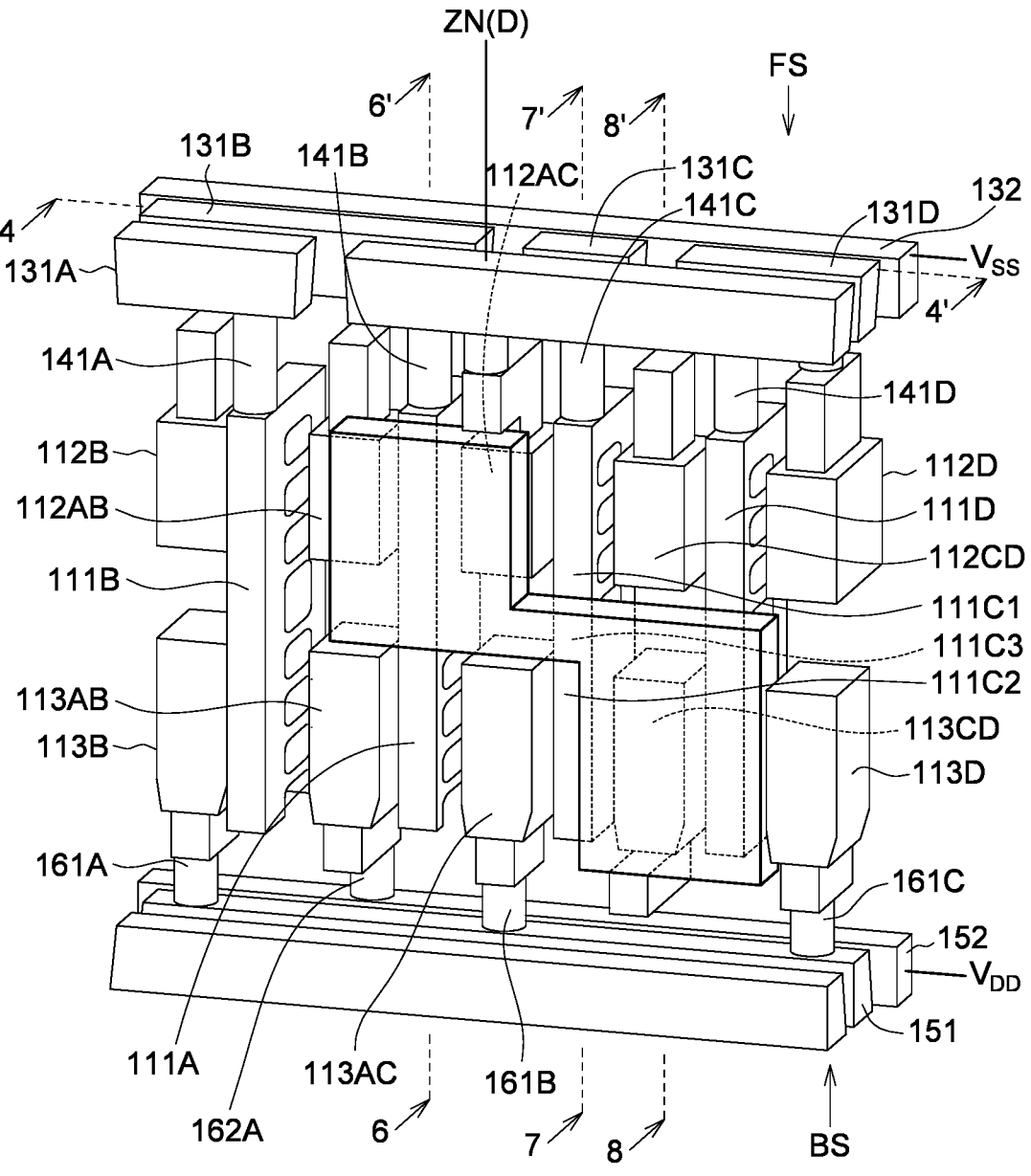
FIG. 1 illustrates a schematic diagram of an integrated circuit according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
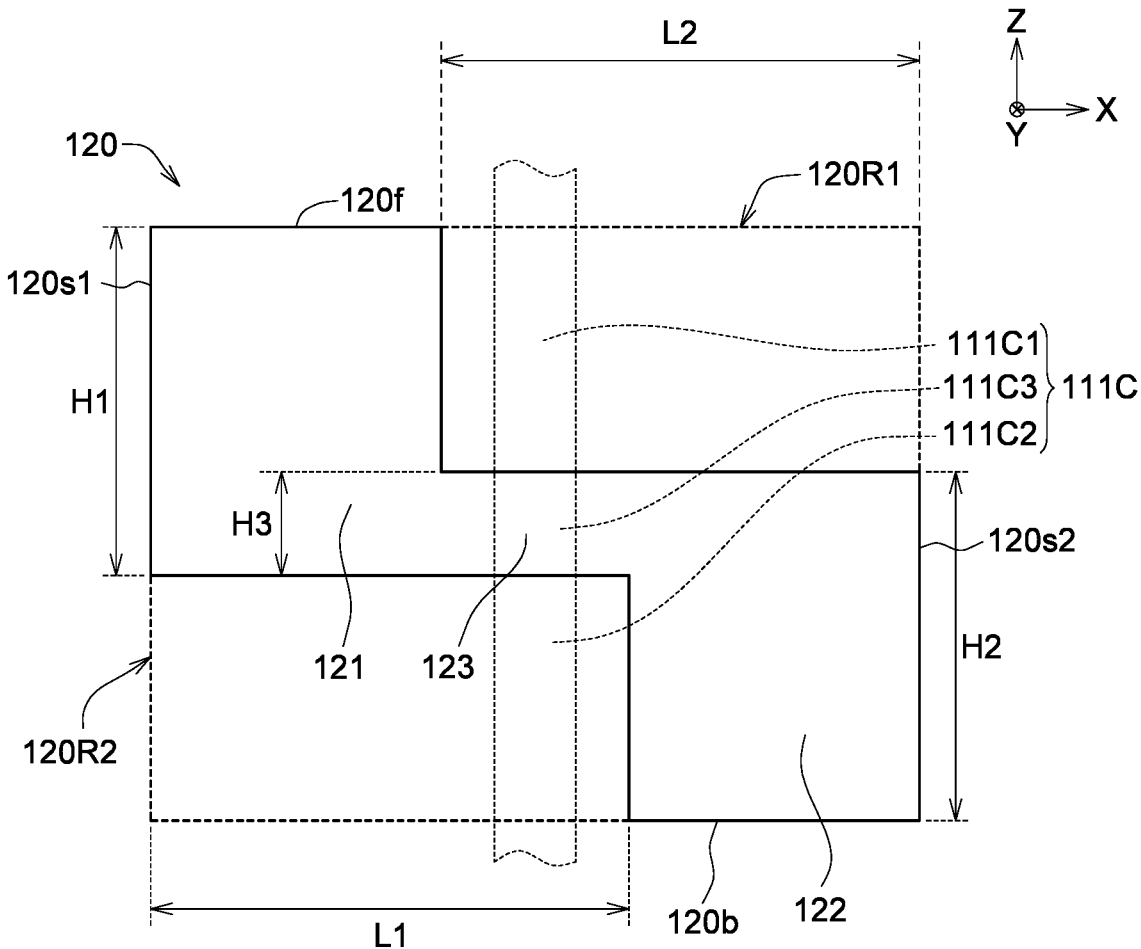
FIG. 2 illustrates a schematic diagram of a view of the vertical local interconnection of FIG. 1 in +Y axis.
Figure 3:
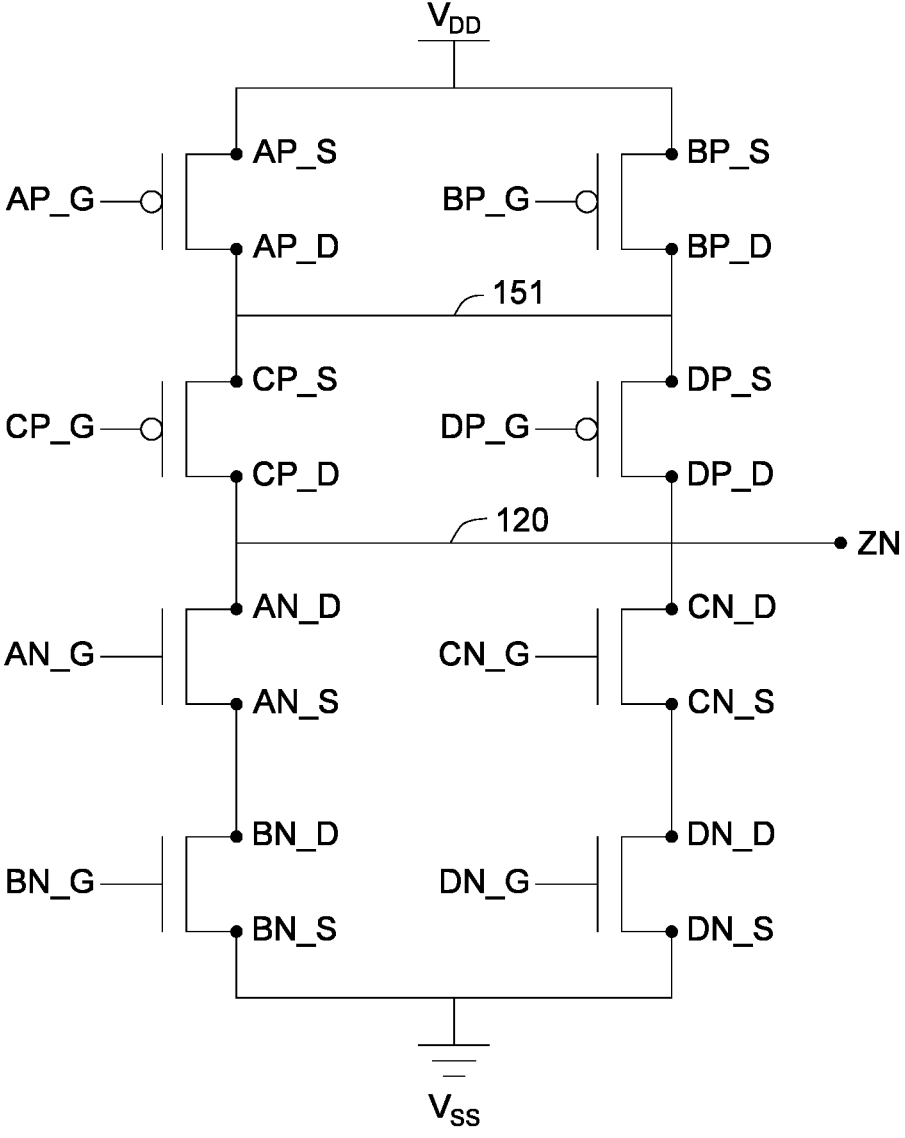
FIG. 3 illustrates an equivalent circuit diagram of the integrated circuit of FIG. 1.
Figure 4:
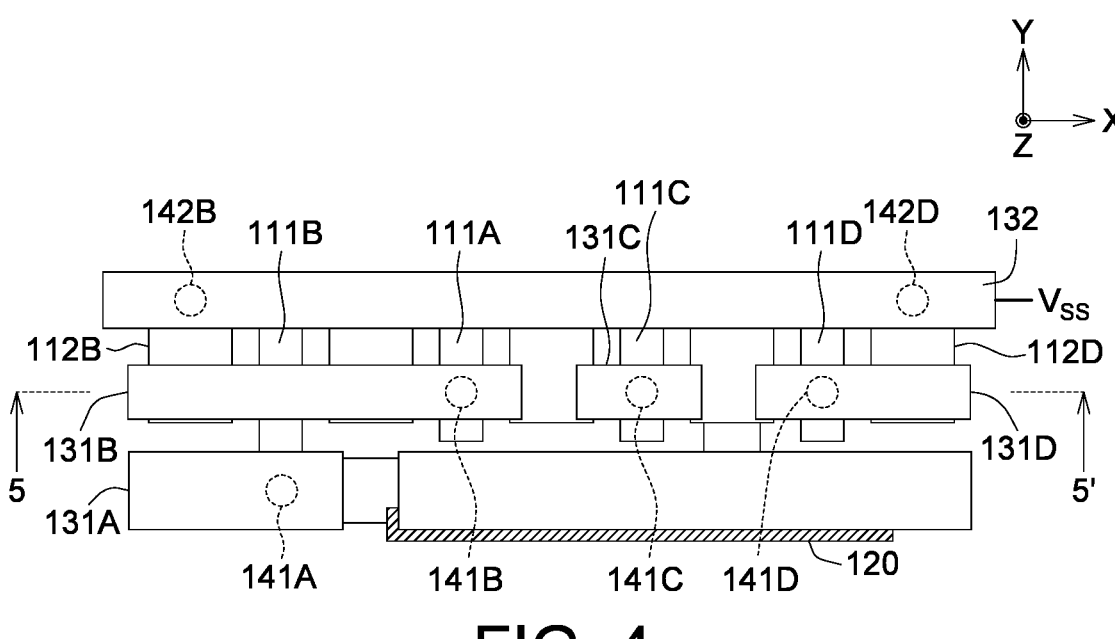
FIG. 4 illustrates a schematic diagram of a top view of the integrated circuit of FIG. 1.
Figure 5:
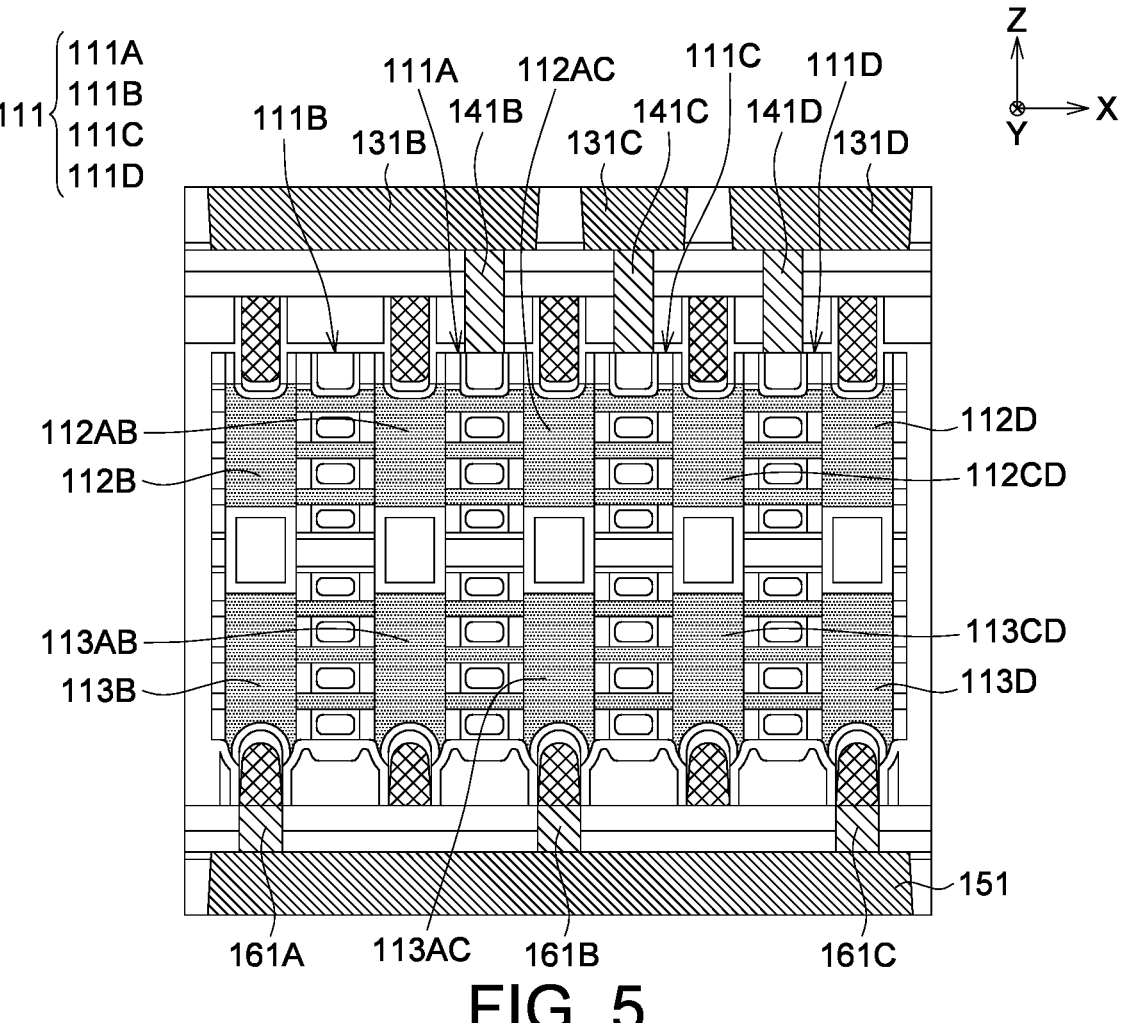
FIG. 5 illustrates a schematic diagram of a cross-sectional view of the integrated circuit of FIG. 1 in a direction 5-5'.

Referring to FIGS. 1 to 5, FIG. 1 illustrates a schematic diagram of an integrated circuit 100 according to an embodiment of the present disclosure, FIG. 2 illustrates a schematic diagram of a view of the vertical local interconnection 120 of FIG. 1 in +Y axis, FIG. 3 illustrates an equivalent circuit diagram of the integrated circuit 100 of FIG. 1, FIG. 4 illustrates a schematic diagram of a top view of the integrated circuit 100 of FIG. 1, and FIG. 5 illustrates a schematic diagram of a cross-sectional view of the integrated circuit 100 of FIG. 1 in a direction 5-5'. The integrated circuit 100 is, for example, CFET (complementary FET) device. In the present disclosure, the integrated circuit 100 is a logic circuit, for example, an AOI (AND-OR-INVERTOR) logic circuit; however, such exemplification is not meant to be for limiting.

As illustrated in FIG. 1, the integrated circuit 100 includes a plurality of transistors 110 and a vertical local interconnection 120. The transistors 110 include a plurality of gate components 111, a plurality of front-side source/drain epitaxies 112 and a plurality of back-side source/drain epitaxies 113, wherein the front-side source/drain epitaxies 112 are closer to a front-side FS of the integrated circuit 100 than the back-side source/drain epitaxies 113. The vertical local interconnection 120 connects a first connected-one 112AC of the front-side source/drain epitaxies 112 with a second connected-one 113CD of the back-side source/drain epitaxy 113. A covered-one 111C of the gate components 111 is located between the first connected-one 112AC and the second connected-one 113CD, the covered-one 111C includes a front-side portion 111C1, a back-side portion 111C2 and a covered portion 111C3 connecting the front-side portion 111C1 with the back-side portion 111C2, and the vertical local interconnection 120 crosses the covered portion 111C3 and exposes the front-side portion 111C1 and the back-side portion 111C2. As a result, it could reduce the parasitic capacitance of gate-to-drain and accordingly increase the oscillation frequency (response speed) of the integrated circuit 100. In comparison to the conventional integrated circuit, the integrated circuit 100 may increase the oscillation frequency by at least 3%.

As illustrated in FIG. 1, due to the structure of the vertical local interconnection 120 of the present embodiment, the overlapping area of the vertical local interconnection 120 overlapping to the gate component 111 in Y-axis may be reduced, and accordingly the parasitic capacitance of gate-to-drain may be reduced.

As illustrated in FIG. 2, the vertical local interconnection 120 may be formed of a material including, for example, a metal such as Cu, Co, Ru, W, etc. The vertical local interconnection 120 may be shaped as a Z-shape, etc. For example, the vertical local interconnection 120 includes a first notch 120R1, a second notch 120R2, a first lateral surface 120$s$1, a second lateral surface 120$s$2 opposite to the first lateral surface 120$s$1, a front-side surface 120$f$ and a back-side surface 120$b$ opposite to the front-side surface 120$f$. The first notch 120R1 extends toward a first-one of the first lateral surface 120$s$1 and the second lateral surface 120$s$2 from a second-one of the first lateral surface 120$s$1 and the second lateral surface 120$s$2. The first notch 120R1 extends toward a third-one of the front-side surface 120$f$ and the back-side surface 120$b$ from a fourth-one of the front-side surface 120$f$ and the back-side surface 120$b$. Although not illustrated, the first notch 120R1 may be filled up with a dielectric material.

As illustrated in FIG. 2, the second notch 120R2 extends toward the second-one of the first lateral surface 120$s$1 and the second lateral surface 120$s$2 from the first-one of the first lateral surface 120$s$1 and the second lateral surface 120$s$2. The second notch 120R2 extends toward the fourth-one of the front-side surface 120$f$ and the back-side surface 120$b$ from the third-one of the front-side surface 120$f$ and the back-side surface 120$b$. Although not illustrated, the second notch 120R2 may be filled up with a dielectric material.

As illustrated in FIG. 2, the vertical local interconnection 120 includes a first portion 121, a second portion 122 and a third portion 123 connecting the first portion 121 with the second portion 122. The third portion 123 projected on the vertical local interconnection 120 in −Y axis overlaps the covered portion 111C3 of the gate component 111C. In another embodiment, a portion of the first portion 121 and/or a portion of the second portion 122 may overlap the covered portion 111C3 in −Y axis.

As illustrated in FIG. 2, the first portion 121 has a first height H1 ranging between, for example, 10 nanometers (nm) to 100 nm, the second portion 122 has a second height H2 ranging between, for example, 10 nm to 100 nm, and the third portion 123 has a second height H3 ranging between, for example, 10 nm to 100 nm. In addition, the first portion 121 has a first width L1 ranging between, for example, 40 nm to 1000 nm, and the second portion 122 has a second width L2 ranging between, for example, 40 nm to 1000 nm. In addition, the vertical local interconnection 120 has a thickness W1 ranging between, for example, 5 nm to 20 nm.

As illustrated in FIG. 1, the gate components 111 include a gate component 111A, a gate component 111B, a gate component 111C and a gate component 1111D. The front-side source/drain epitaxies 112 include a front-side source/drain epitaxy 112AB, the front-side source/drain epitaxy 112AC, a front-side source/drain epitaxy 112B, a front-side source/drain epitaxy 112CD and a front-side source/drain epitaxy 112D. The back-side source/drain epitaxies 113 include a back-side epitaxy 113AB, a back-side epitaxy 113AC, a back-side epitaxy 113B, the back-side epitaxy 113CD and a back-side epitaxy 113D.

As illustrated in FIG. 2, the equivalent circuit of the integrated circuit 100 includes eight transistors, such as a transistor AP, a transistor BP, a transistor CP and a transistor DP, a transistor AN, a transistor BN, a transistor CN and a transistor DN. The transistor AP includes a gate AP_G, a source AP_S and a drain AP_D, the transistor BP includes a gate BP_G, a source BP_S and a drain BP_D, the transistor CP includes a gate CP_G, a source CP_S and a drain CP_D, the transistor DP includes a gate DP_G, a source DP_S and a drain DP_D, the transistor AN includes a gate AN_G, a source AN_S and a drain AN_D, the transistor BN includes a gate BN_G, a source BN_S and a drain BN_D, the transistor CN includes a gate CN_G, a source CN_S and a drain CN_D, the transistor DN includes a gate DN_G, a source DN_S and a drain DN_D. The integrated circuit 100 includes eight inputs, such as the gate AP_G, the gate AN_G, the gate BP_G, the gate BN_G, the gate CP_G, the gate CN_G, the gate DP_G and the gate DN_G.

As illustrated in FIGS. 1 and 3, the front-side source/drain epitaxies 112 are, for example, NMOS, while the back-side source/drain epitaxies 113 are, for example, PMOS. The gate component 111A is corresponding to the gate AP_G and the gate AN_G, the gate component 111B is corresponding to the gate BP_G and the gate BN_G, the gate component 111C is corresponding to the gate CP_G and the gate CN_G, and the gate component 111D is corresponding to the gate DP_G and the gate DN_G, wherein the gate AP_G of the transistor AP and the gate AN_G of the transistor AN share the gate component 111A, the gate BP_G of the transistor BP and the gate BN_G of the transistor BN share the gate component 111B, the gate CP_G of the transistor CP and the gate CN_G of the transistor CN share the gate component 111C, and the gate DP_G of the transistor DP and the gate DN_G of the transistor DN share the gate component 111D.

A source/drain of a transistor and a source/drain of another transistor may share a source/drain epitaxy.

As illustrated in FIGS. 1 and 3, the source AN_S of the transistor AN and the drain BN_D the transistor BN share the front-side source/drain epitaxy 112AB, and the source CN_S of the transistor CN and the drain DN_D of the transistor DN share the front-side source/drain epitaxy 112CD. A NMOS and a PMOS share the first connected-one, and the first connected-one is drain epitaxy. For example, the drain AN_D of the transistor AN and the drain CP_D of the transistor CP share the front-side source/drain epitaxy 112AC (for example, the first connected-one).

As illustrated in FIGS. 1 and 3, the source AP_S of the transistor AP and the source BP_S of the transistor BP share the back-side source/drain epitaxy 113AB, and the drain AP_D of the transistor AP and the source CP_S of the transistor CP share the back-side source/drain epitaxy 113AC. A NMOS and a PMOS share the second connected-one, and the second connected-one is drain epitaxy. For example, the drain CP_D of the of the transistor CP and the drain CN_D of the of the transistor CN share the back-side source/drain epitaxy 113CD (for example, the second connected-one).

As illustrated in FIG. 3, the vertical local interconnection 120 connects the first connected-one and the second connected-one in parallel. The integrated circuit 100 further includes an output node ZN coupled to the drain CP_D of the transistor CP, the drain AN_D of the transistor AN, the drain DP_D of the transistor DP and the drain CN_D of the transistor CN. Furthermore, as illustrated in FIGS. 1 and 3, the front-side source/drain epitaxy 112AC (the first connected-one, corresponding to the drain CP_D of the transistor CP and the drain AN_D of the transistor AN) and the back-side source/drain epitaxy 113CD (the second connected-one, corresponding to the drain DP_D of the transistor DP and the drain CN_D of the transistor CN) are connected through the vertical local interconnection 120.

As illustrated in FIGS. 1, 3 and 5, the integrated circuit 100 further includes a plurality of front-side conductive segments 131A, 131B, 131C and 131D, and a plurality of front-side conductive vias 141A, 141B, 141C and 141D. The front-side conductive via 141A connects the front-side conductive segments 131A and the gate component 111B, the front-side conductive via 141B connects the front-side conductive segments 131B and the gate component 111A, the front-side conductive via 141C connects the front-side conductive segments 131C and the gate component 111C, and the front-side conductive via 141D connects the front-side conductive segments 131D and the gate component 111D.

As illustrated in FIG. 3, the source BN_S of the transistor BN and the source DN_S of the transistor DN are electrically coupled to a voltage $V_{SS}$. For example, as illustrated in FIGS. 1 and 4, the integrated circuit 100 further includes at least one front-side conductive segment 132, at least one front-side conductive via 142B and at least one front-side conductive via 142D. The front-side conductive via 142B connects the front-side conductive segment 132 and the front-side source/drain epitaxy 112B, and the front-side conductive via 142D connects the front-side conductive segment 132 and the front-side source/drain epitaxy 112D. The front-side source/drain epitaxy 112B (corresponding to the source BN_S of the transistor BN) and the front-side source/drain epitaxy 112D (corresponding to the source DN_S of the transistor DN) are electrically coupled to the voltage $V_{SS}$ through the front-side conductive segment 132.

As illustrated in FIG. 3, the drain AP_D of the transistor AP, the drain CP_S of the transistor CP, the drain BP_D of the transistor BP and the drain DP_S of the transistor DP are electrically coupled. For example, as illustrated in FIGS. 1 and 5, the integrated circuit 100 further includes at least one back-side conductive segments 151, and a plurality of back-side conductive vias 161A, 161B and 161C. The back-side conductive via 161A connects the back-side conductive segment 151 and the back-side source/drain epitaxy 113B, the back-side conductive via 161B connects the back-side conductive segment 151 and the back-side source/drain epitaxy 113AC, and the back-side conductive via 161C connects the back-side conductive segment 151 and the back-side source/drain epitaxy 113D. The back-side source/drain epitaxy 113B (corresponding to the drain BP_D of the transistor BP), the back-side source/drain epitaxy 113AC (corresponding to the drain AP_D of the transistor AP and the source CP_S of the transistor CP) and the back-side source/drain epitaxy 113D (corresponding to the source DP_S of the transistor DP) are electrically coupled to the back-side conductive segment 151 through the back-side conductive via 161A, the back-side conductive via 161B and the back-side conductive via 161C.

As illustrated in FIG. 3, the source AP_S of the transistor AP and the source BP_S of the transistor BP are electrically coupled to a voltage VDD. For example, as illustrated in FIG. 1, the integrated circuit 100 further includes a back-side conductive segment 152, and at least one back-side conductive via 162A. The back-side conductive via 162A connects the back-side conductive segment 152 and the back-side source/drain epitaxy 113AB. The back-side source/drain epitaxy 113AB (corresponding to the source AP_S of the transistor AP and the source BP_S of the transistor BP) is electrically coupled to the voltage VDD through the back-side conductive segment 152.

Figure 6:
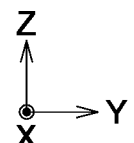
FIG. 6 illustrates a schematic diagram of a cross-sectional view of the integrated circuit of FIG. 1 in a direction 6-6'.
Figure 6:
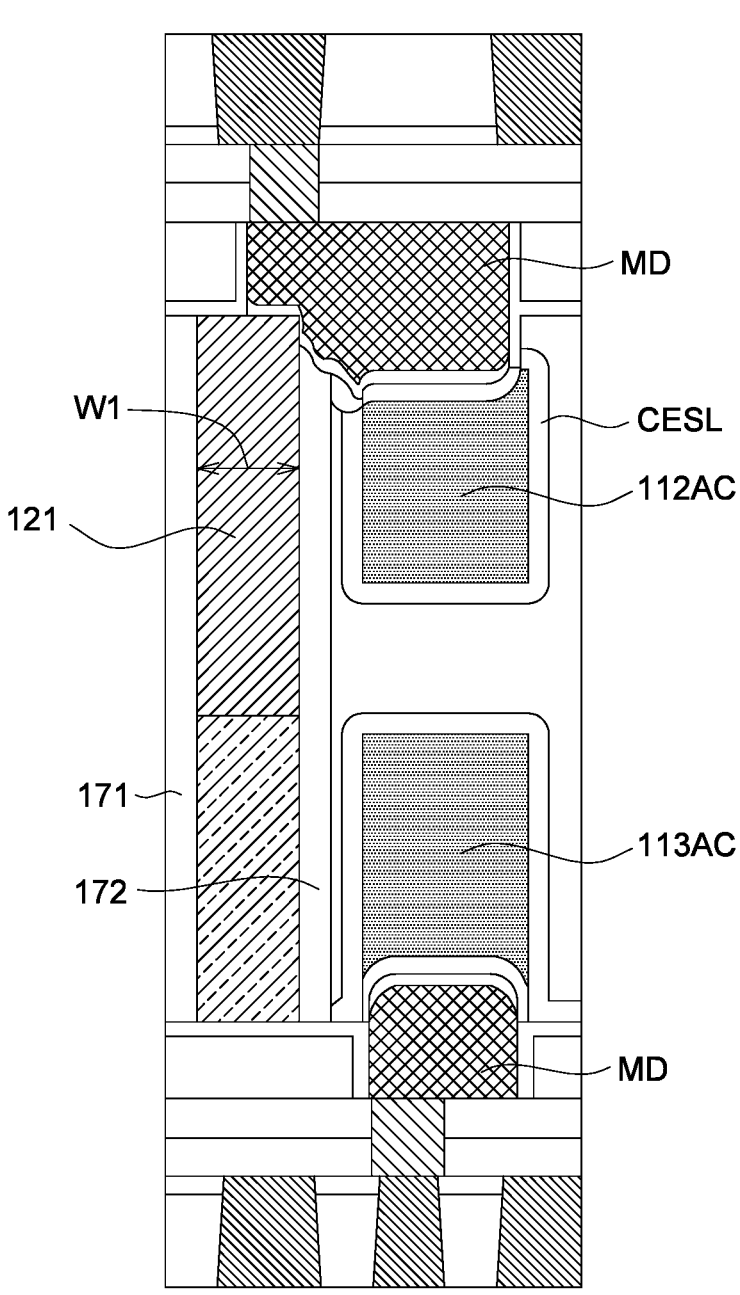
Figure 7:
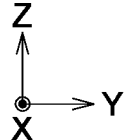
FIG. 7 illustrates a schematic diagram of a cross-sectional view of the integrated circuit of FIG. 1 in a direction 7-7'.
Figure 7:
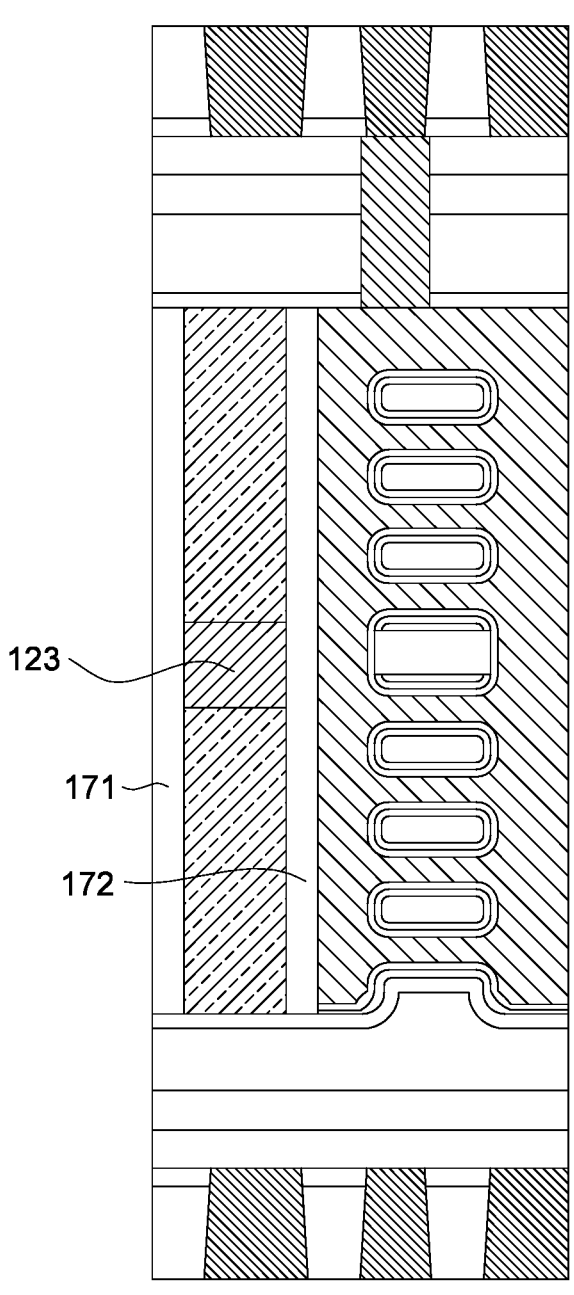
Figure 8:
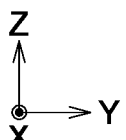
FIG. 8 illustrates a schematic diagram of a cross-sectional view of the integrated circuit of FIG. 1 in a direction 8-8'.
Figure 8:
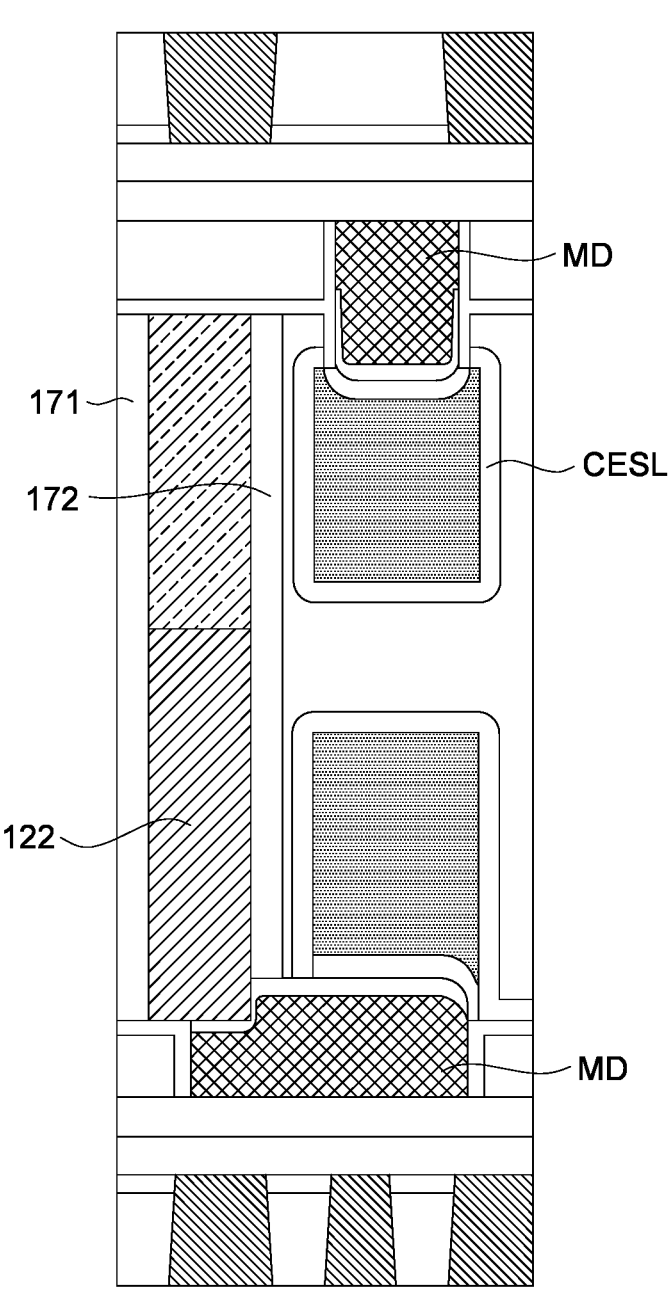

Referring to FIGS. 6 to 8, FIG. 6 illustrates a schematic diagram of a cross-sectional view of the integrated circuit 100 of FIG. 1 in a direction 6-6', FIG. 7 illustrates a schematic diagram of a cross-sectional view of the integrated circuit 100 of FIG. 1 in a direction 7-7', and FIG. 8 illustrates a schematic diagram of a cross-sectional view of the integrated circuit 100 of FIG. 1 in a direction 8-8'.

As illustrated in FIGS. 6 to 8, the integrated circuit 100 further includes a plurality of contact etch stop layer CESL each covering the corresponding front-side source/drain epitaxy 112 or back-side source/drain epitaxy 113. The integrated circuit 100 further includes a plurality of metal over diffusions MD electrically connected with the corresponding front-side source/drain epitaxy 112 or back-side source/drain epitaxy 113, and the conductive via (the front-side conductive via or the back-side conductive via) is electrically connected with the epitaxy through the metal over diffusion MD. The integrated circuit 100 further includes an interlayer dielectric covering the front-side source/drain epitaxies and the back-side source/drain epitaxies. In addition, the integrated circuit 100 further includes a first dielectric sidewall 171 and a second dielectric sidewall 172 respectively formed on opposite two sides of the vertical local interconnection 120 for electrically isolated from the front-side source/drain epitaxy and the back-side source/drain epitaxy. The first dielectric sidewall 171 and the second dielectric sidewall 172 are, for example, CMG (cut metal gate) dielectric. The first dielectric sidewall 171 and the second dielectric sidewall 172 may be formed of a material including, for example, SiN, SiCN, SiOC, SiO2, etc.

Figure 9:
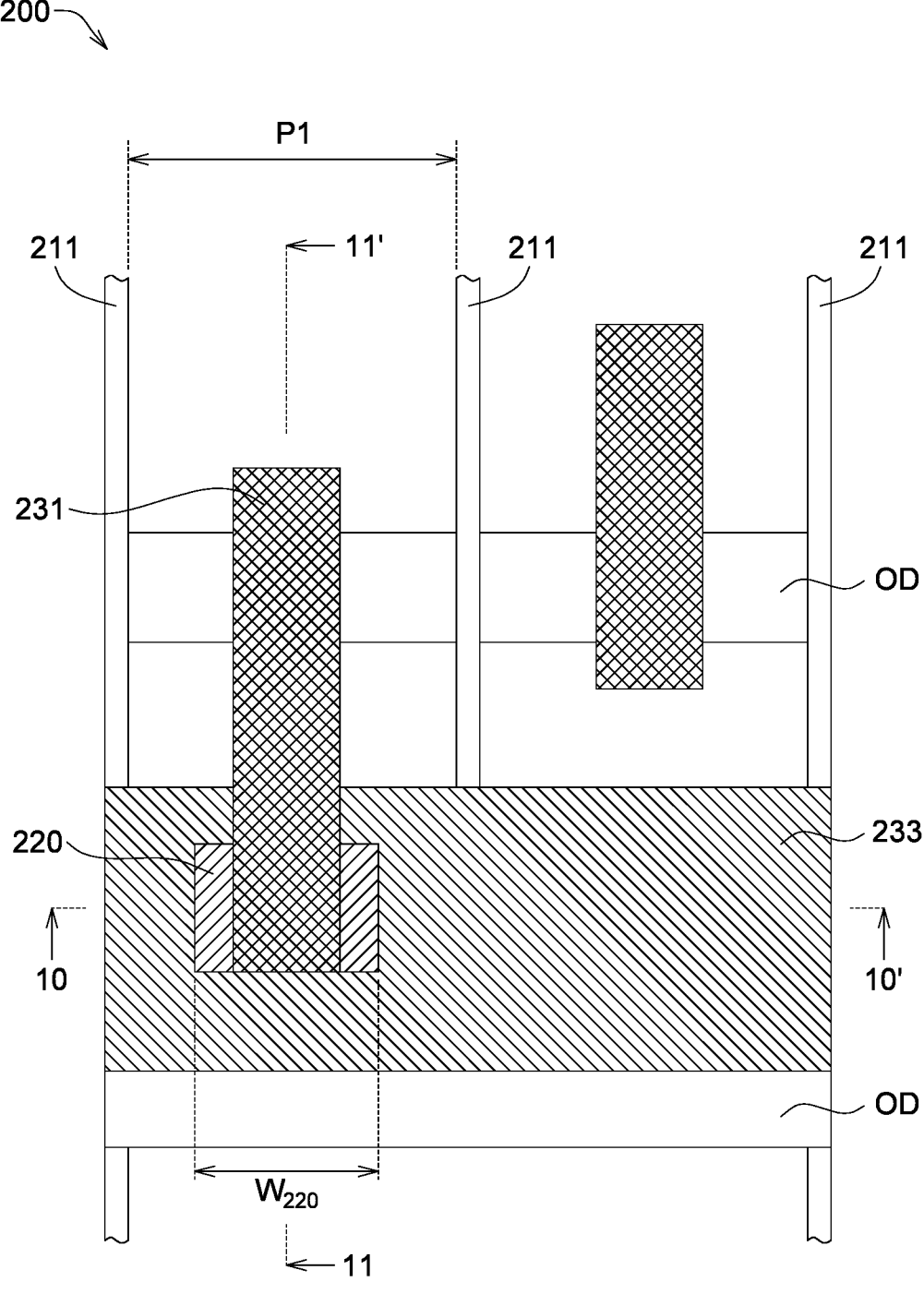
FIG. 9 illustrates a schematic diagram of an integrated circuit according to an embodiment of the present disclosure.
Figure 10:
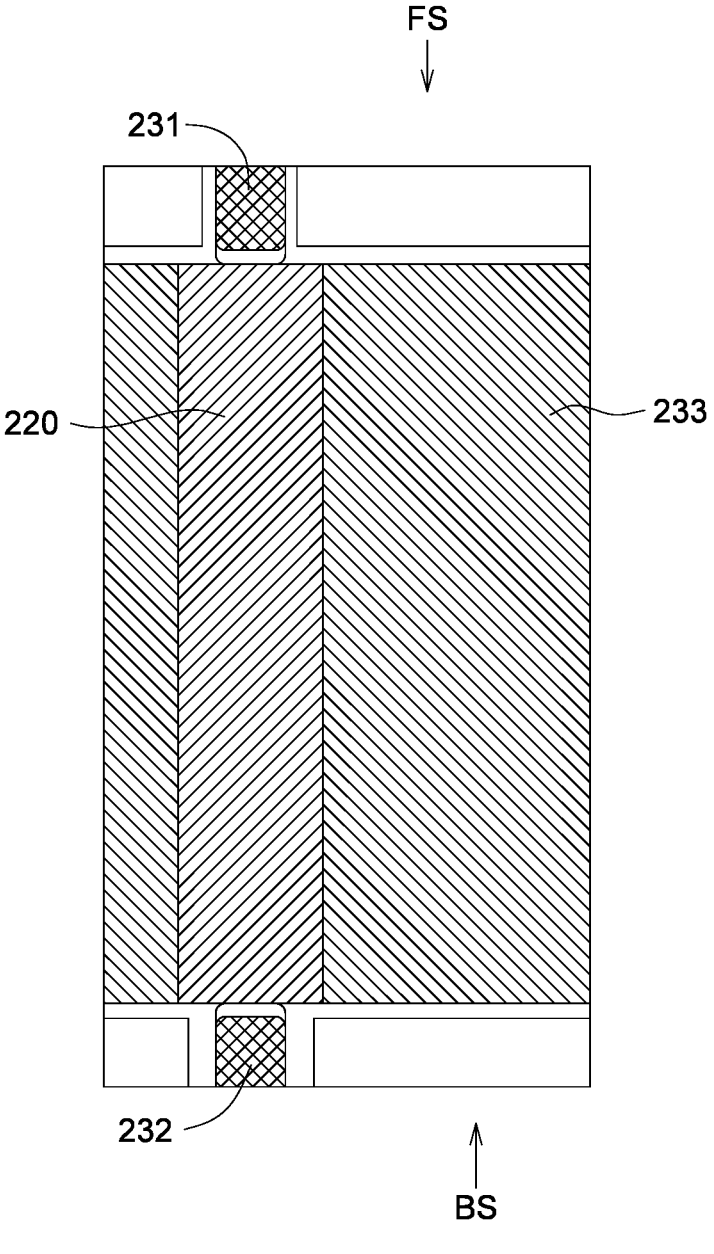
FIG. 10 illustrates a schematic diagram of a cross-sectional view of the integrated circuit of FIG. 9 in a direction 10-10.
Figure 11:
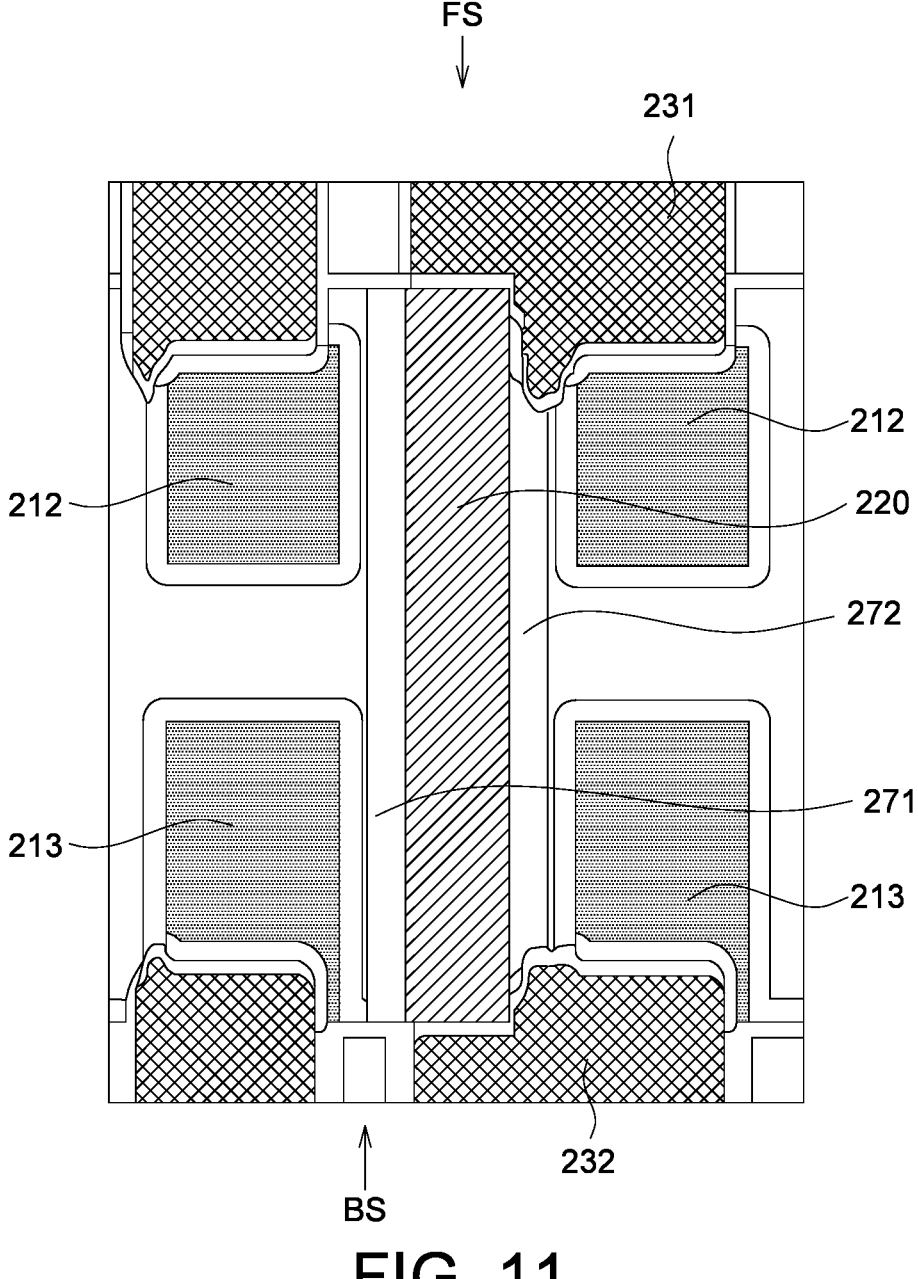
FIG. 11 illustrates a schematic diagram of a cross-sectional view of the integrated circuit of FIG. 9 in a direction 11-11'.

Referring to FIGS. 9 to 11, FIG. 9 illustrates a schematic diagram of an integrated circuit 200 according to an embodiment of the present disclosure, FIG. 10 illustrates a schematic diagram of a cross-sectional view of the integrated circuit 200 of FIG. 9 in a direction 10-10, and FIG. 11 illustrates a schematic diagram of a cross-sectional view of the integrated circuit 200 of FIG. 9 in a direction 11-11'.

As illustrated in FIGS. 9 to 11, the integrated circuit 200 includes the features the same as or similar to that of the integrated circuit 100 except that, for example, the integrated circuit 200 includes a vertical local interconnection 220 different from the vertical local interconnection 120 in structure and the number of the transistors is different. The integrated circuit 200 may be is a logic circuit different from the integrated circuit 100.

As illustrated in FIGS. 9 to 11, the integrated circuit 200 further includes at least one gate component 211, at least one front-side source/drain epitaxies 212, at least one back-side source/drain epitaxies 213, at least one front-side conductive portion 231, at least one back-side conductive portion 232, at least one cut metal gate (CMG) 233, a first dielectric sidewall 271 and a second dielectric sidewall 272. The front-side conductive portion 231 and the back-side conductive portion 232 are, for example, metal over diffusions (MD).

As illustrated in FIGS. 9 to 11, the front-side source/drain epitaxies 212 and the back-side source/drain epitaxies 213 form at least two transistors. The vertical local interconnection 220 connects a first-connected one of the front-side source/drain epitaxies 212 and a second-connected one of the back-side source/drain epitaxies 213, wherein the first-connected one and the second-connected one are opposite to each other in Z-axis. The front-side conductive portion 231 electrically connects at least one of the one front-side source/drain epitaxies 212 with the vertical local interconnection 220, and the back-side conductive portion 232 electrically connects at least one of the one back-side source/drain epitaxies 213 with the vertical local interconnection 220. In the present embodiment, the vertical local interconnection 220 extends in a straight line or single straight line, for example, Z-axis. In addition, the vertical local interconnection 220 is formed on in cut metal gate 233. The cut metal gate 233 may be formed of a material including, for example, a dielectric material. The first dielectric sidewall 271 and a second dielectric sidewall 272 respectively formed on opposite two sides of the vertical local interconnection 220 for electrically isolated from the front-side source/drain epitaxy and the back-side source/drain epitaxy.

As illustrated in FIG. 9, there is a contacted poly pitch (CPP) P1 between adjacent two metal gates G1, wherein the pitch P1 ranges between, for example, 20 nanometer (nm) to 60 nm, even greater, or even smaller. In the present embodiment, the vertical local interconnection 220 has a width $W_{220}$ less than the pitch P1. As a result, it could reduce the parasitic capacitance of gate-to-drain and accordingly increase the oscillation frequency (response speed) of the integrated circuit 200.

Referring to FIGS. 12A to 22, FIGS. 12A to 22 illustrate schematic diagrams of manufacturing processes of the integrated circuit 100 of FIG. 1.

Figure 12A:
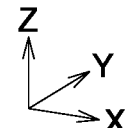
FIG. 12A illustrates a schematic diagram of a dielectric layer formed within an integrated circuit.
Figure 12A:
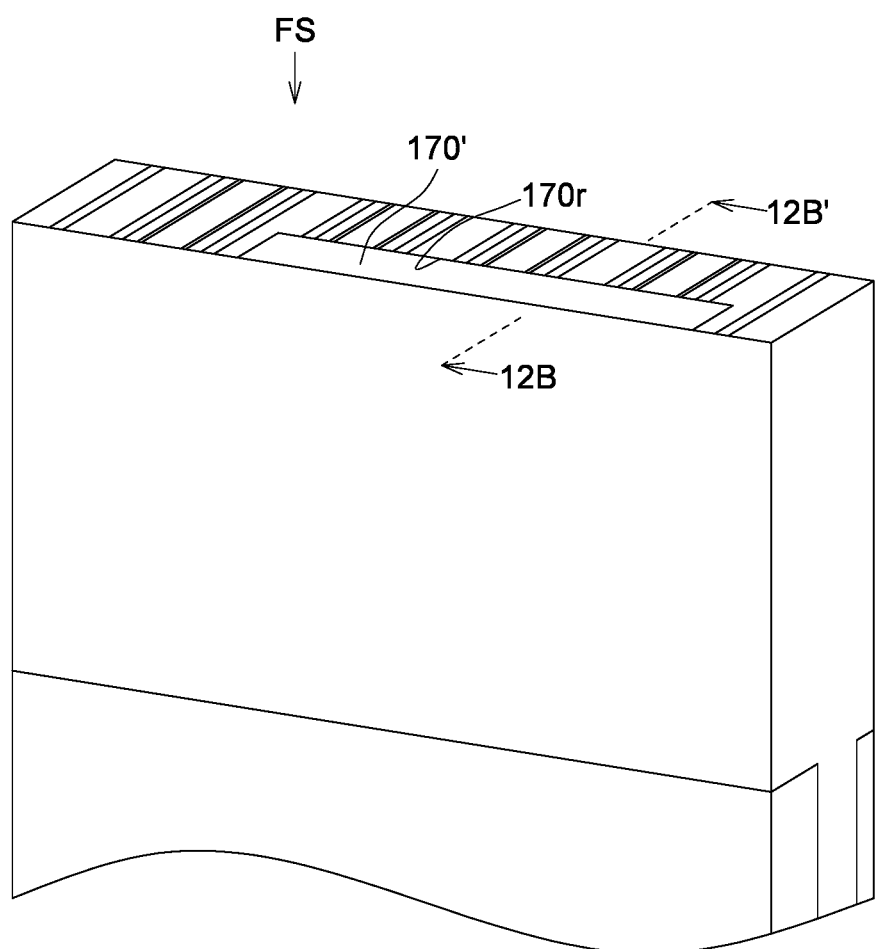
Figure 12B:
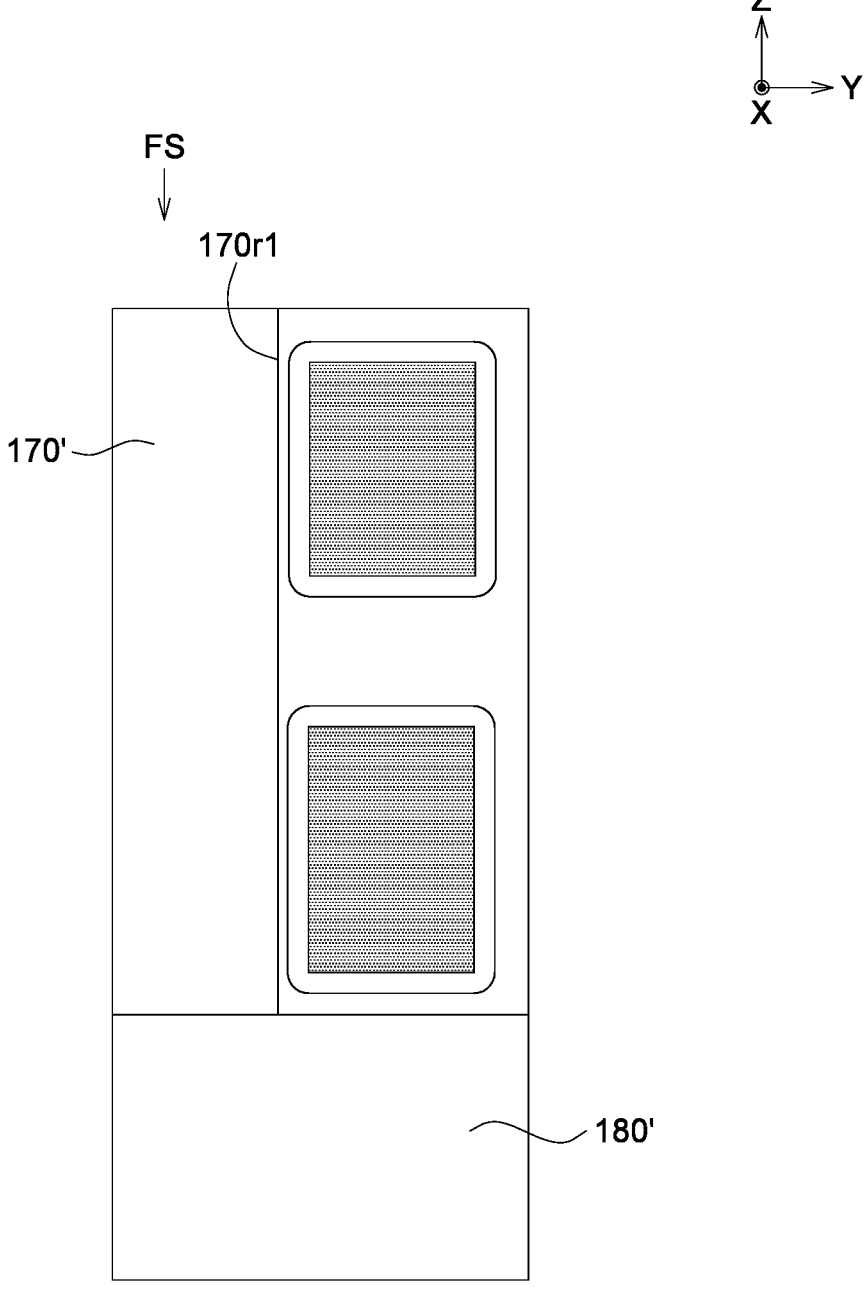
FIG. 12B illustrates a schematic diagram of the integrated circuit of FIG. 12A in a direction 8B-8B'.

As illustrated in FIGS. 12A and 12B, FIG. 12A illustrates a schematic diagram of a dielectric layer 170' formed within an integrated circuit 100', and FIG. 12B illustrates a schematic diagram of the integrated circuit 100' of FIG. 12A in a direction 8B-8B'. In this step, the front-side FS of the integrated circuit 100' faces up. Although no illustrated, the integrated circuit 100' including the gate components 111, the front-side source/drain epitaxies 112, the back-side source/drain epitaxies 113 and an insulation layer 180' is formed, wherein the back-side source/drain epitaxies 113 are formed on the insulation layer 180', and the dielectric layer 170' is formed within a recess $170r1$ of the interlayer dielectric. The recess $170r1$ is, for example, a recess for cut metal gate. The dielectric layer 170' may be formed of a material including, for example, SiN, SiCN, SiOC, SiO2, etc.

Figure 13A:
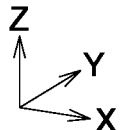
FIG. 13A illustrates a schematic diagram of forming a recess on the dielectric layer of FIG. 13A.
Figure 13A:
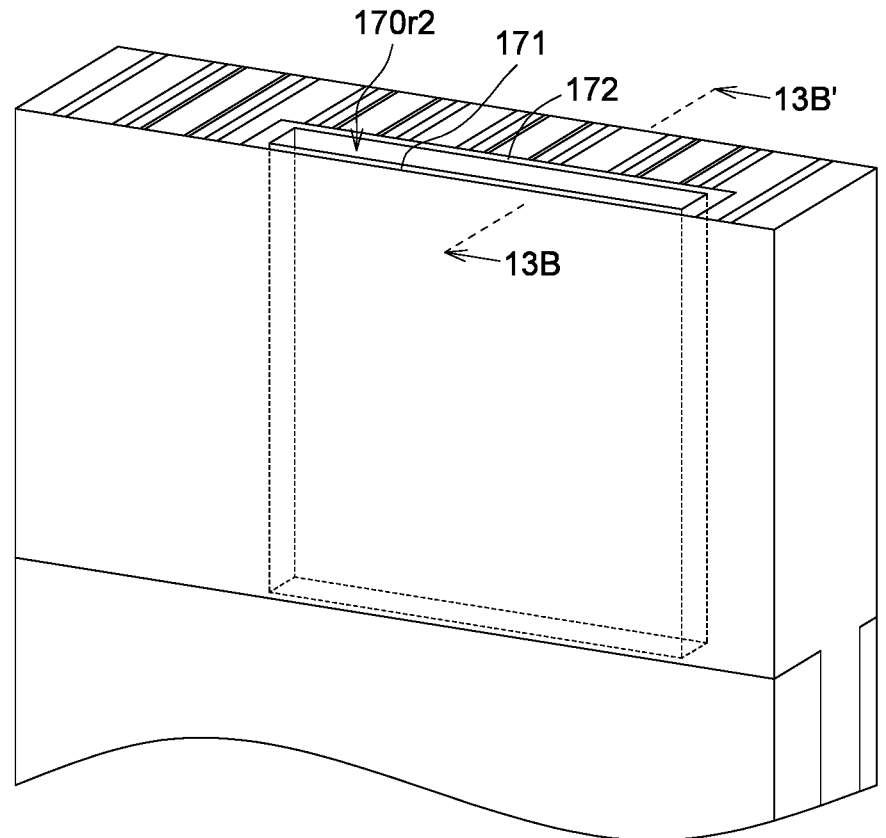
Figure 13B:
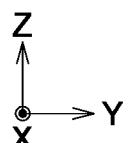
FIG. 13B illustrates a schematic diagram of the integrated circuit of FIG. 13A in a direction 13B-13B'.
Figure 13B:
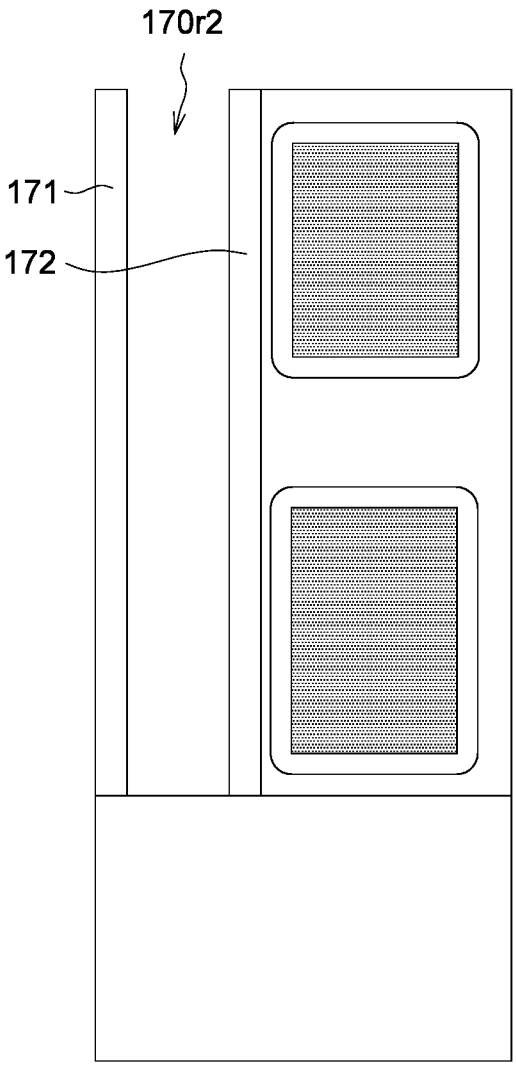

As illustrated in FIGS. 13A and 13B, FIG. 13A illustrates a schematic diagram of forming a recess $170r2$ on the dielectric layer 170' of FIG. 13A, and FIG. 13B illustrates a schematic diagram of the integrated circuit 100' of FIG. 13A in a direction 13B-13B'. In this step, the recess $170r2$ is formed on the dielectric layer 170' by using, for example, etching, such as an anisotropic plasma dry etching, etc. After the recess $170r2$ is formed, a remaining portion of the remaining dielectric layer 170' includes the first dielectric sidewall 171 and the second dielectric sidewall 172.

Figure 14A:
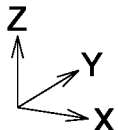
FIG. 14A illustrates a schematic diagram of forming a vertical local interconnection material within the recess.
Figure 14A:
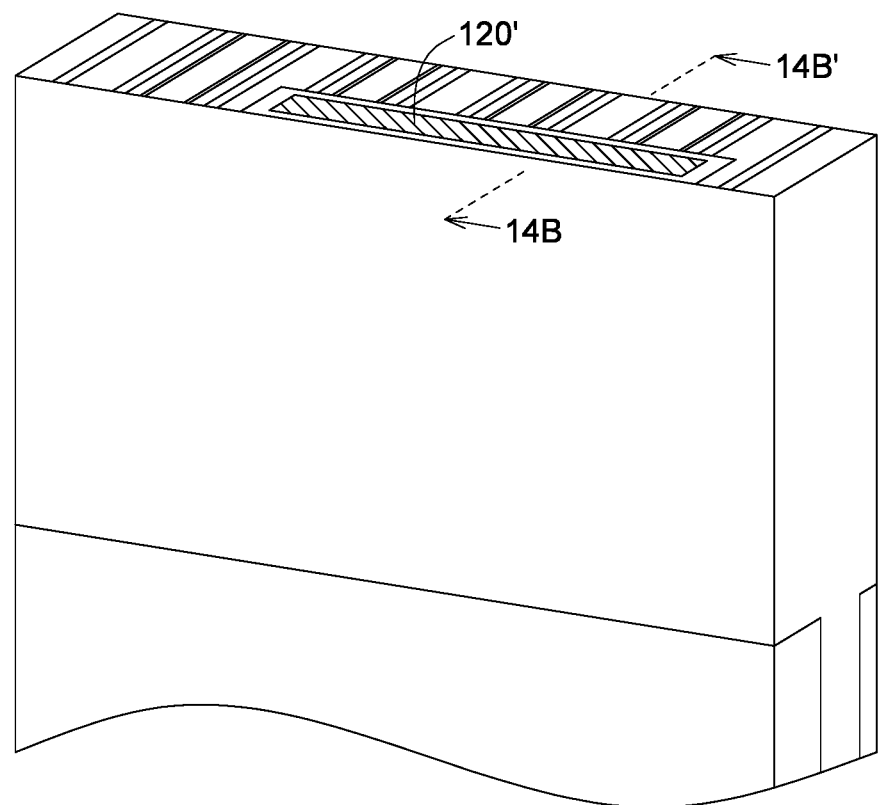
Figure 14B:
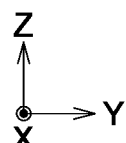
FIG. 14B illustrates a schematic diagram of the integrated circuit of FIG. 14A in a direction 14B-14B'.
Figure 14B:
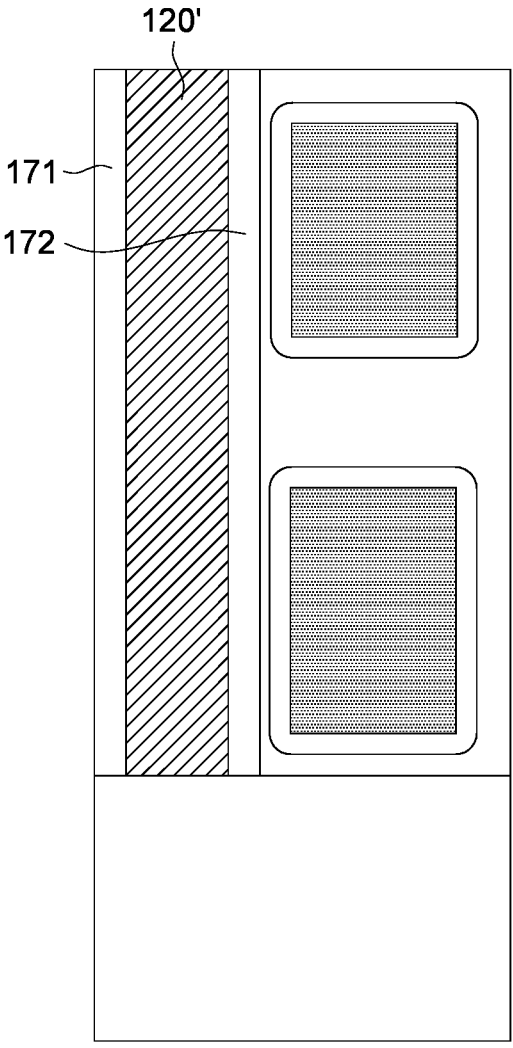

As illustrated in FIGS. 14A and 14B, FIG. 14A illustrates a schematic diagram of forming a vertical local interconnection material 120' within the recess $170r2$, and FIG. 14B illustrates a schematic diagram of the integrated circuit 100' of FIG. 14A in a direction 14B-14B'. In this step, the vertical local interconnection material 120' fills up the recess $170r2$ by using, for example, deposition, electroplating, etc.

Figure 15A:
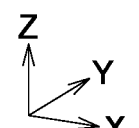
FIG. 15A illustrates a schematic diagram of forming a photoresist on the integrated circuit of FIG. 14A.
Figure 15A:
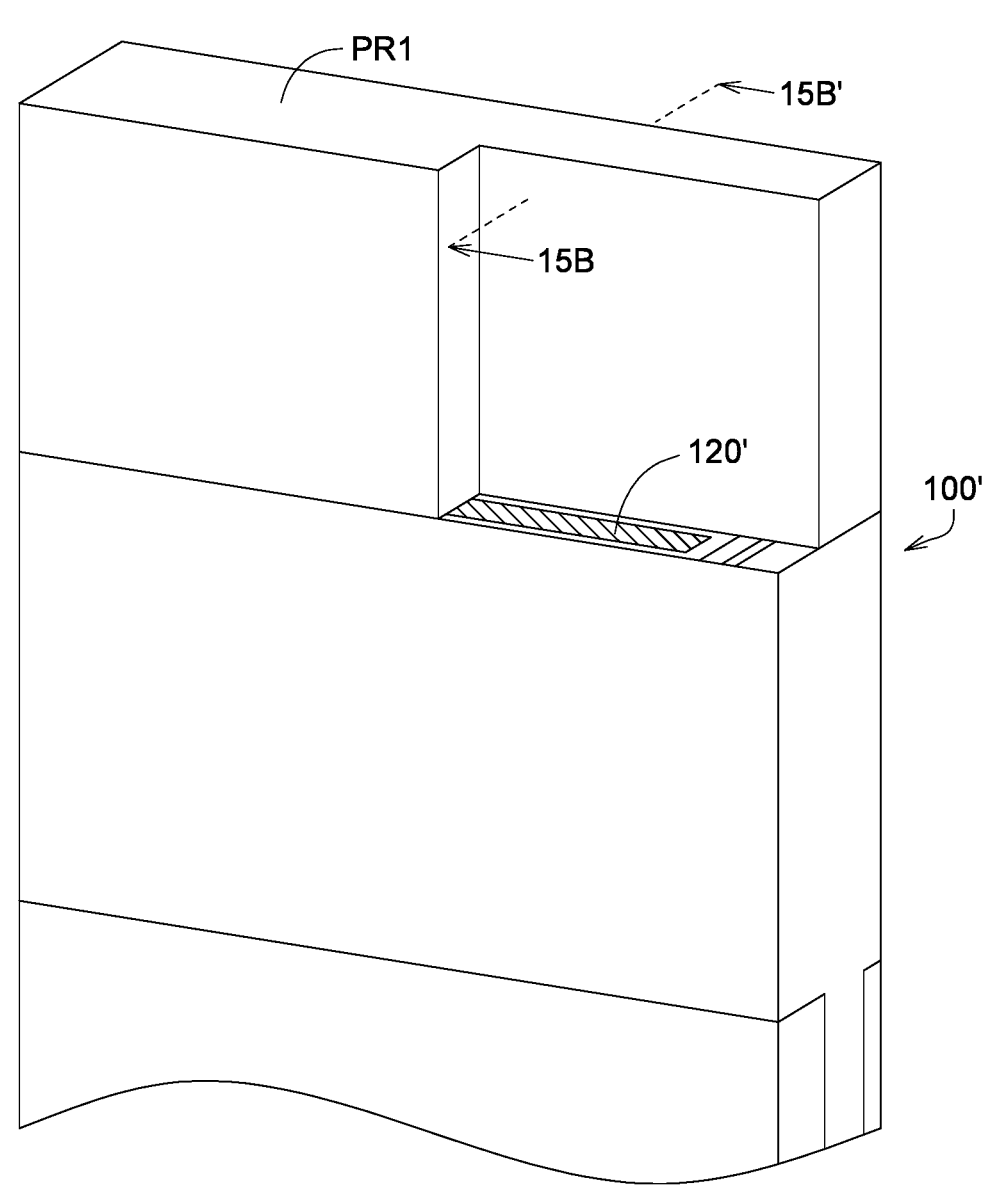
Figure 15B:
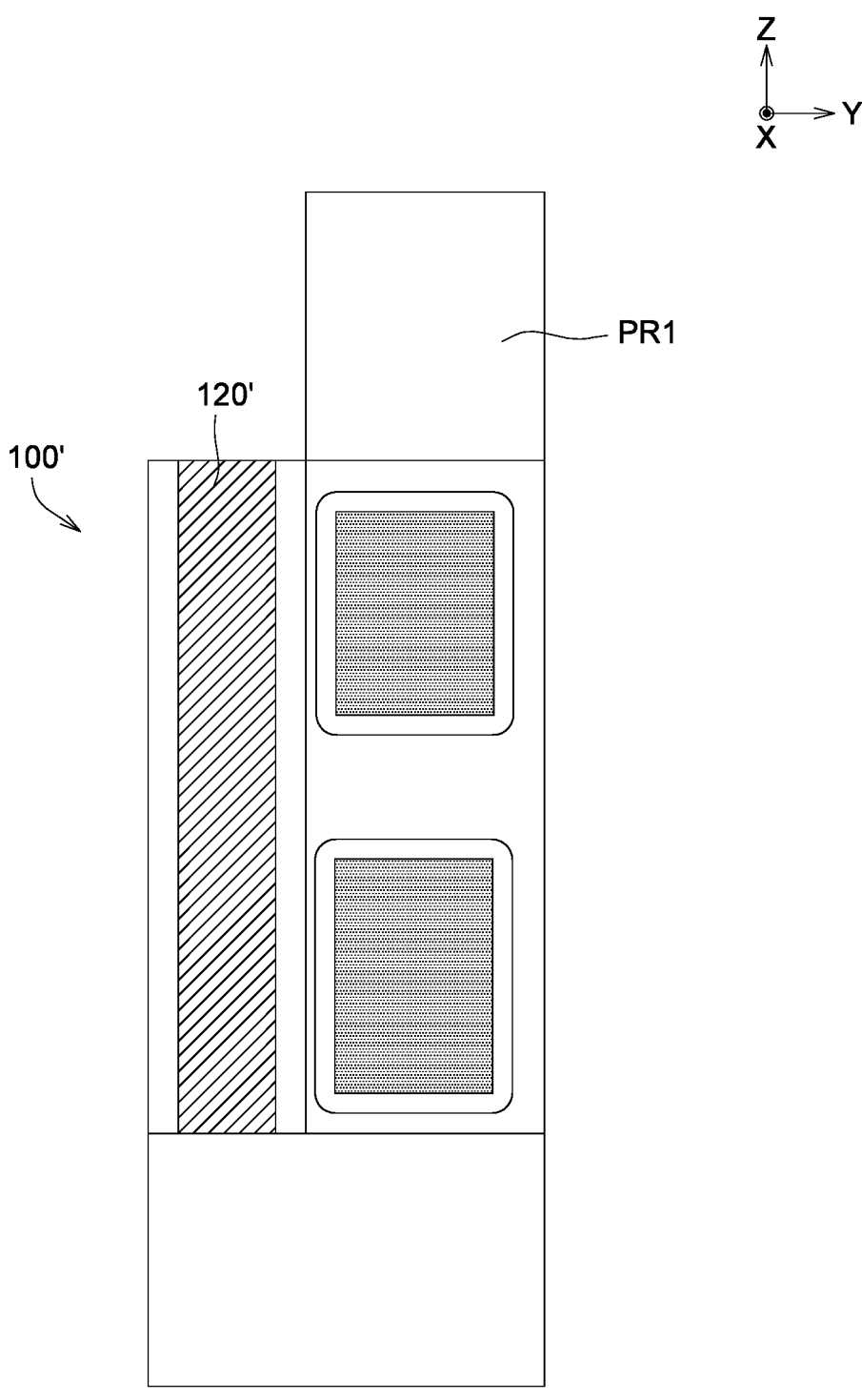
FIG. 15B illustrates a schematic diagram of the integrated circuit of FIG. 15A in a direction 15B-15B'.

As illustrated in FIGS. 15A and 15B, FIG. 15A illustrates a schematic diagram of forming a photoresist PR1 on the integrated circuit 100' of FIG. 14A, and FIG. 15B illustrates a schematic diagram of the integrated circuit 100' of FIG. 15A in a direction 15B-15B'. In this step, the photoresist PR1 is formed on the integrated circuit 100' and exposes a portion of the vertical local interconnection 120'.

Figure 16A:
FIG. 16A illustrates a schematic diagram of forming a first notch on the vertical local interconnection.
Figure 16A:
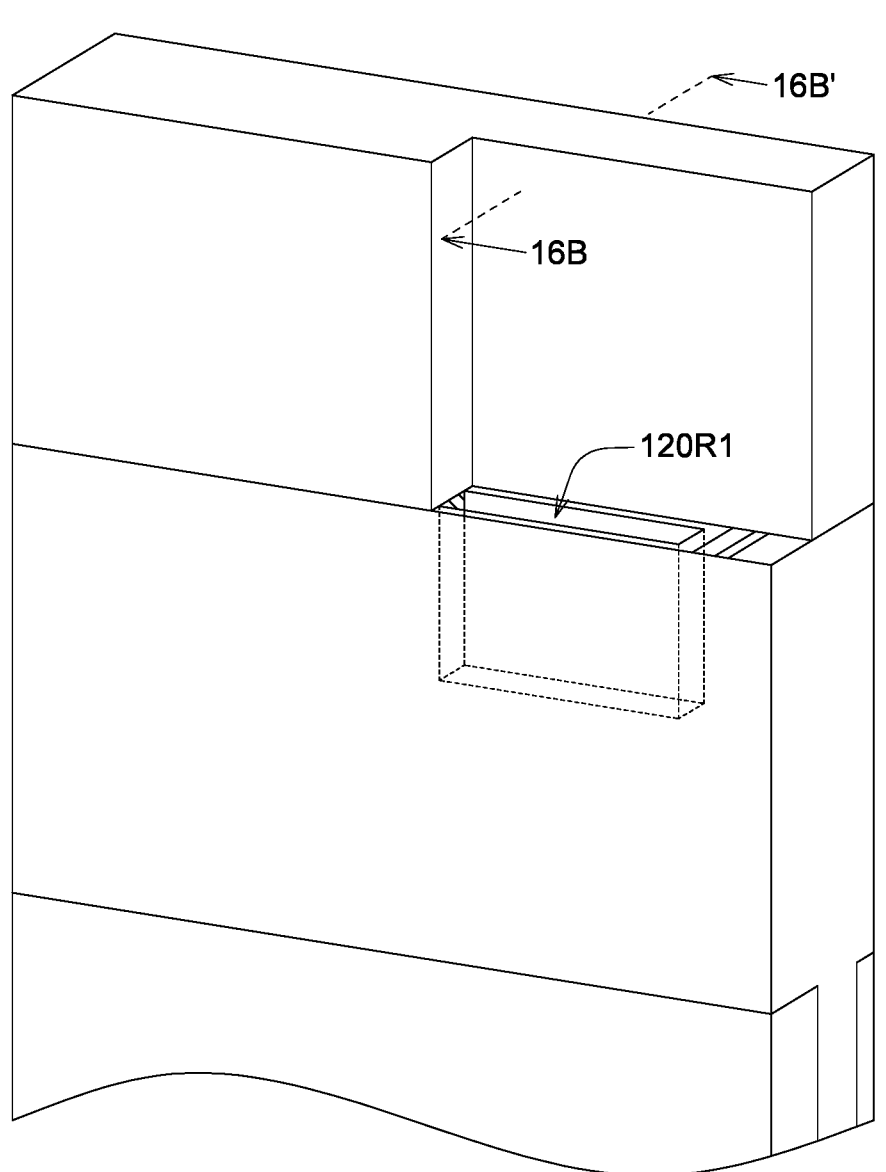
Figure 16B:
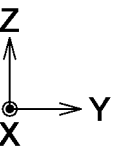
FIG. 16B illustrates a schematic diagram of the integrated circuit of FIG. 16A in a direction 16B-16B'.
Figure 16B:
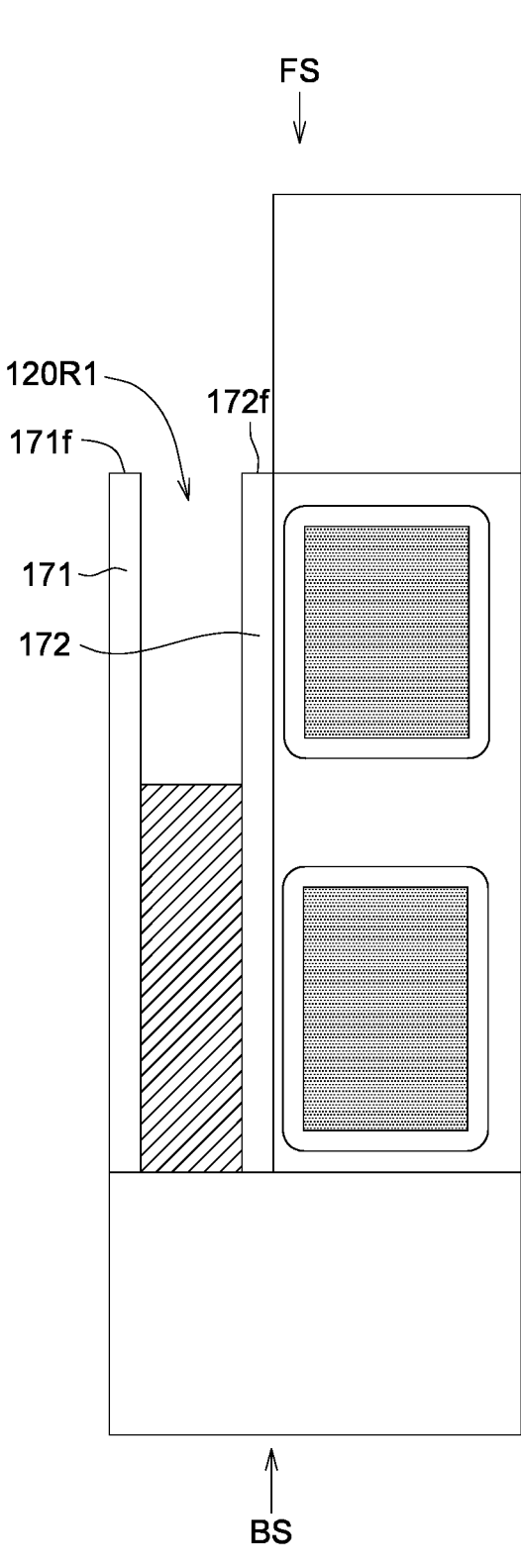

As illustrated in FIGS. 16A and 16B, FIG. 16A illustrates a schematic diagram of forming a first notch 120R1 on the vertical local interconnection 120', and FIG. 16B illustrates a schematic diagram of the integrated circuit 100' of FIG. 16A in a direction 16B-16B'. In this step, the first notch 120R1 is formed on the vertical local interconnection 120' by using, for example, etching, etc. The first notch 120R1 extends from a front-side surface 171f of the first dielectric sidewall 171 and a front-side surface 172f of the second dielectric sidewall 172 toward the back-side BS, but not extend to the insulation layer 180'. In other words, the first notch 120R1 is a blind hole.

Figure 17:
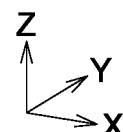
FIG. 17 illustrates a schematic diagram of removing the photoresist.
Figure 17:
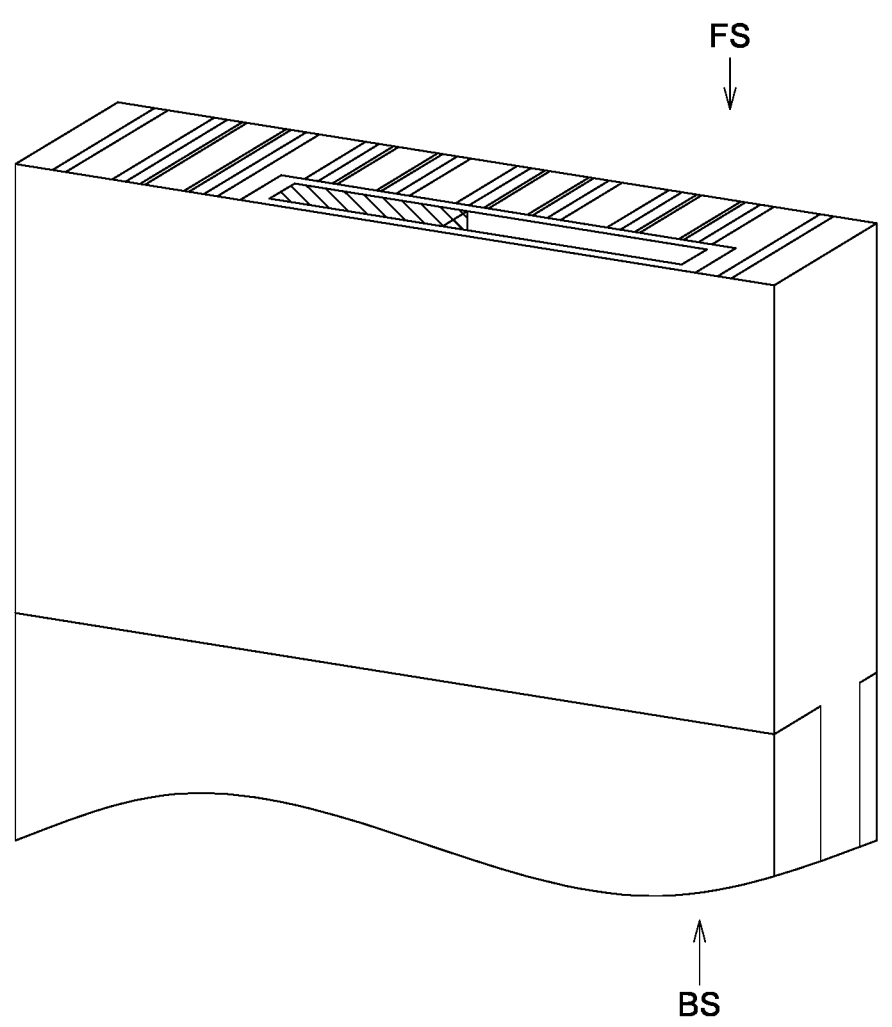

As illustrated in FIG. 17, FIG. 17 illustrates a schematic diagram of removing the photoresist PR1. In this step, the photoresist PR1 of FIG. 16A is removed by using, for example, etching, etc.

Then, a plurality of front-side conductive segments 131A, 131B, 131C and 131D, at least one front-side conductive segment 132, a plurality of front-side conductive vias 141A, 141B, 141C and 141D, and at least one front-side conductive via 142B and at least one front-side conductive via 142D are formed on the structure of FIG. 17.

Figure 18A:
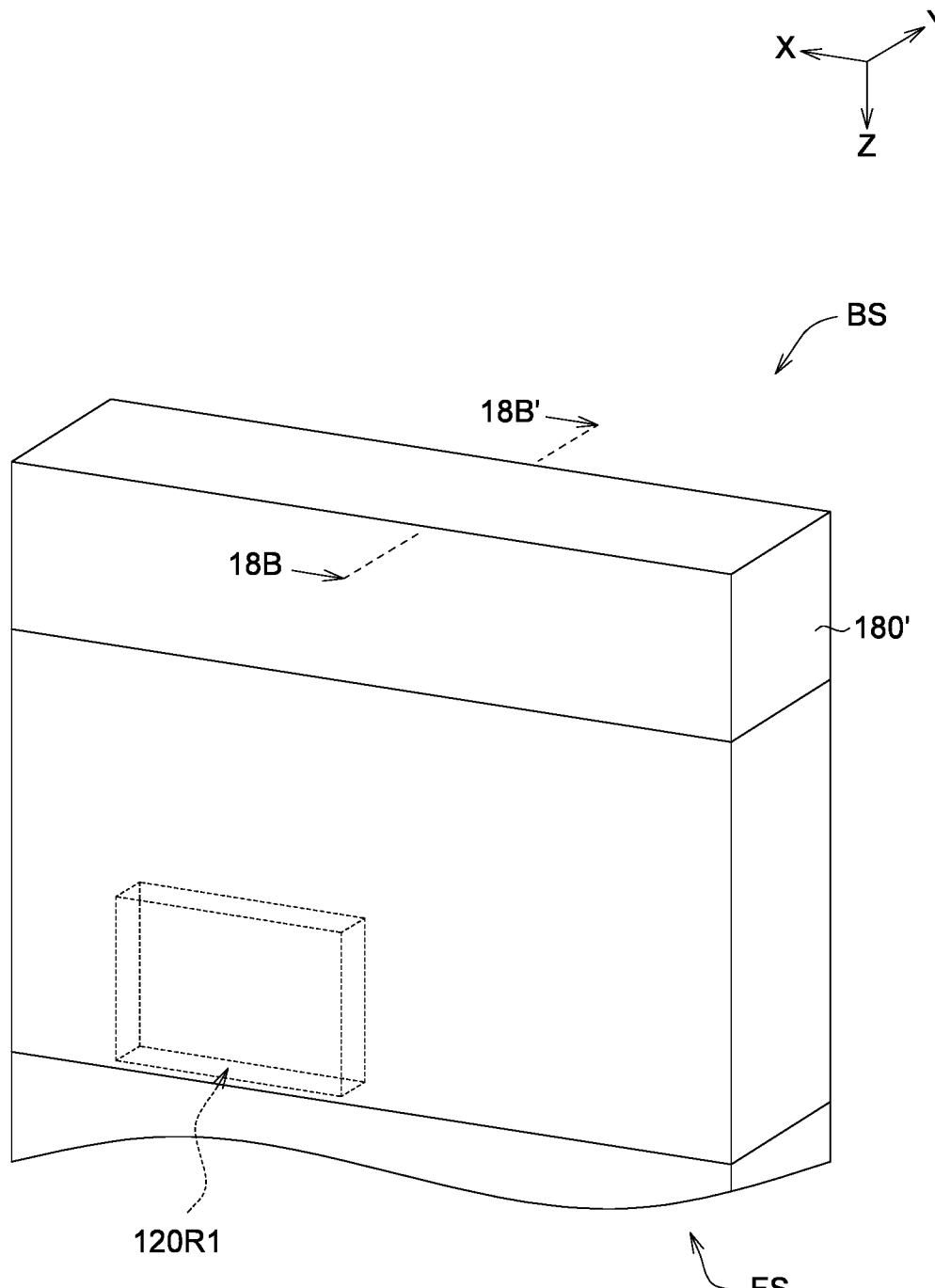
FIG. 18A illustrates a schematic diagram of flipping the integrated circuit of FIG. 17.
Figure 18B:
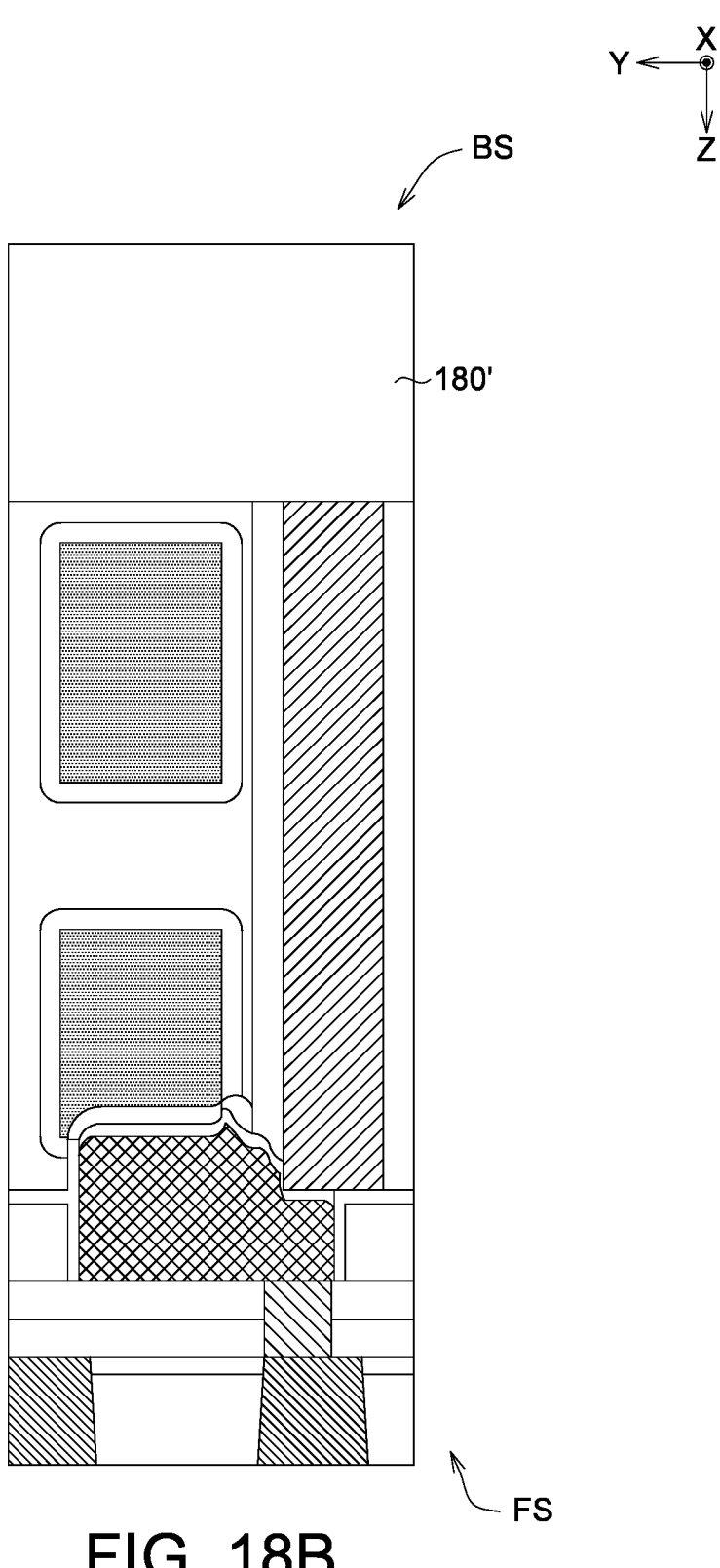
FIG. 18B illustrates a schematic diagram of the integrated circuit of FIG. 18A in a direction 18B-18B'.

As illustrated in FIGS. 18A and 18B, FIG. 18A illustrates a schematic diagram of flipping the integrated circuit 100' of FIG. 17, and FIG. 18B illustrates a schematic diagram of the integrated circuit 100' of FIG. 18A in a direction 18B-18B'. In this step, the back-side BS of the integrated circuit 100' faces up.

Figure 19:
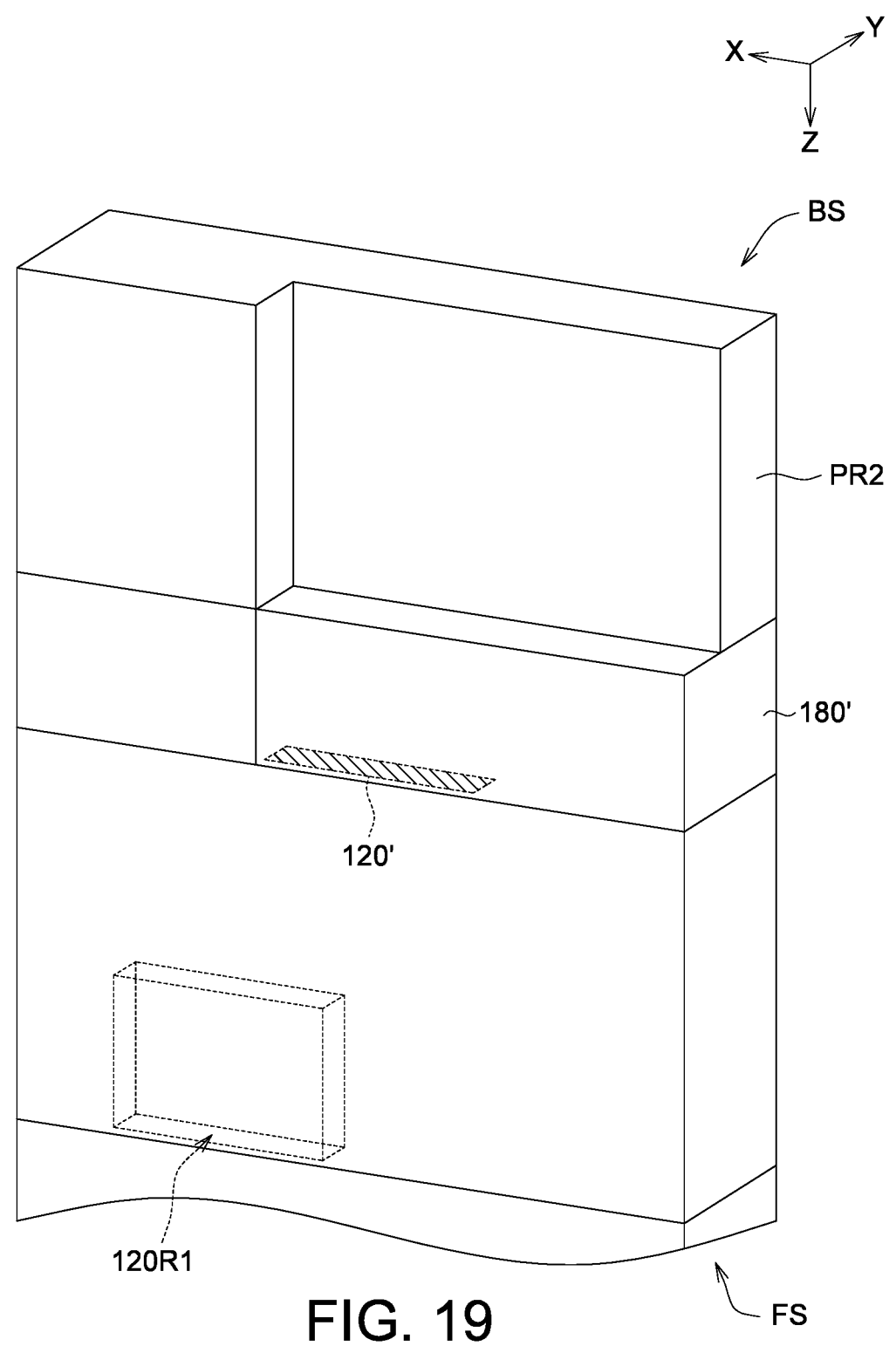
FIG. 19 illustrates a schematic diagram of forming a photoresist on the integrated circuit of FIG. 18A.

As illustrated in FIG. 19, FIG. 19 illustrates a schematic diagram of forming a photoresist PR2 on the integrated circuit 100' of FIG. 18A. In this step, the photoresist PR2 is formed on the integrated circuit 100' and exposes a portion of the insulation layer 180' corresponding to the vertical local interconnection 120'.

Figure 20A:
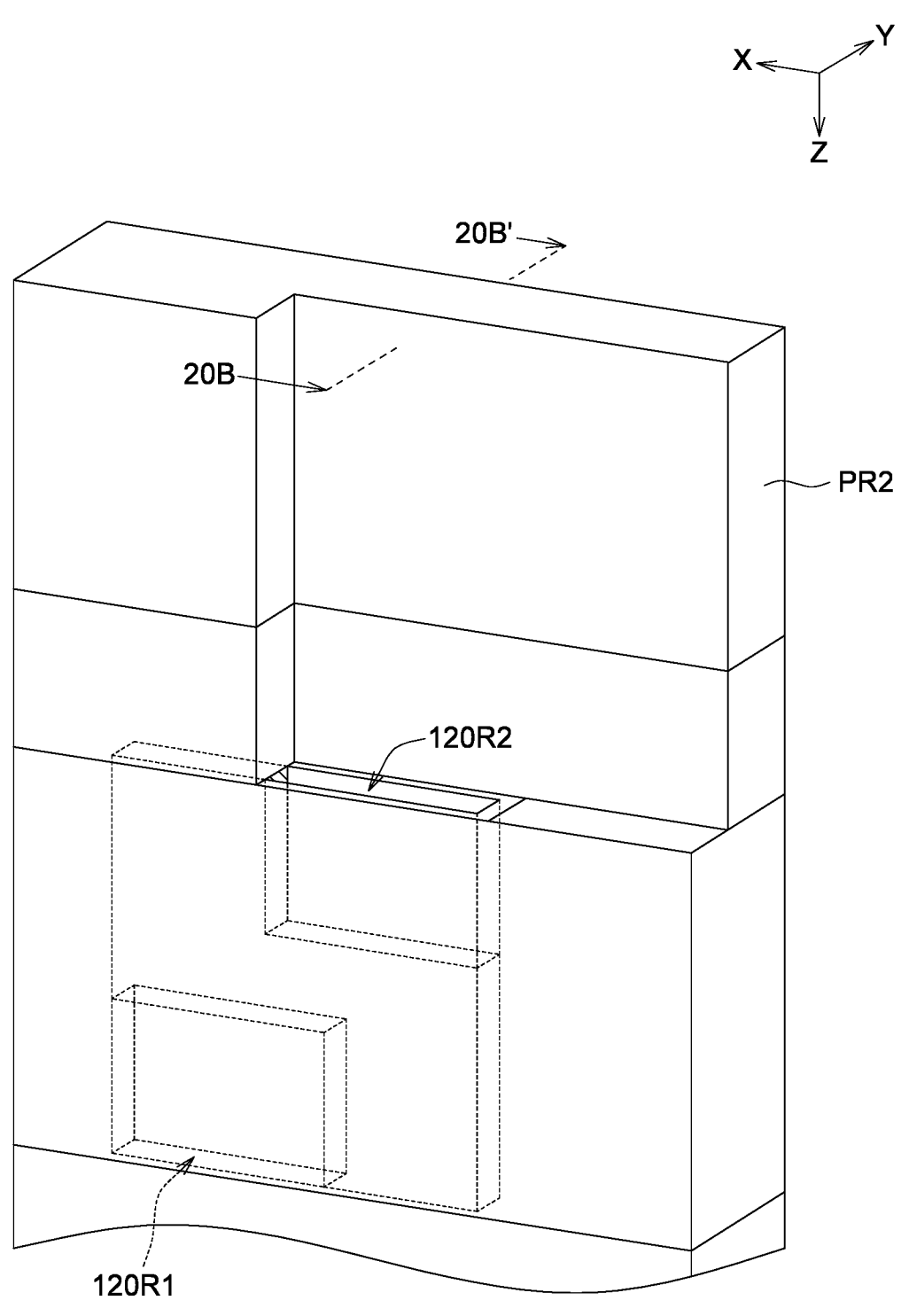
FIG. 20A illustrates a schematic diagram of forming a second notch on the vertical local interconnection.
Figure 20B:
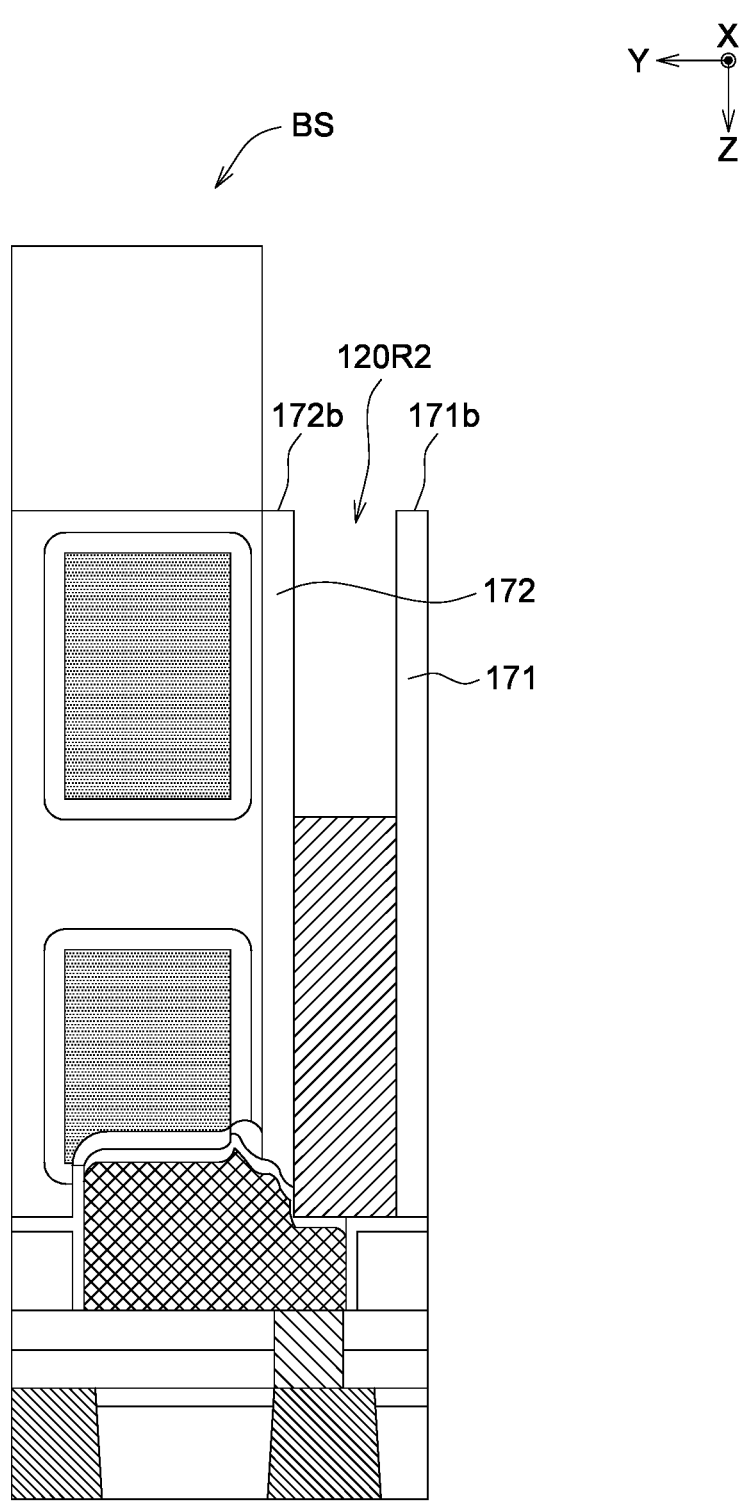
FIG. 20B illustrates a schematic diagram of the integrated circuit of FIG. 20A in a direction 20B-20B'.

As illustrated in FIGS. 20A and 20B, FIG. 20A illustrates a schematic diagram of forming a second notch 120R2 on the vertical local interconnection 120', and FIG. 20B illustrates a schematic diagram of the integrated circuit 100' of FIG. 20A in a direction 20B-20B'. In this step, the second notch 120R2 is formed on the vertical local interconnection 120' to form the vertical local interconnection 120 by using, for example, etching, etc. The second notch 120R2 extends from a back-side surface 171b of the back-side dielectric sidewall 171 and a back-side surface 172b of the second dielectric sidewall 172 toward the front-side FS. In an embodiment, the second notch 120R2 is a blind hole.

Figure 21:
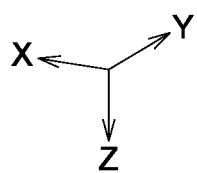
FIG. 21 illustrates a schematic diagram of removing the photoresist.
Figure 21:
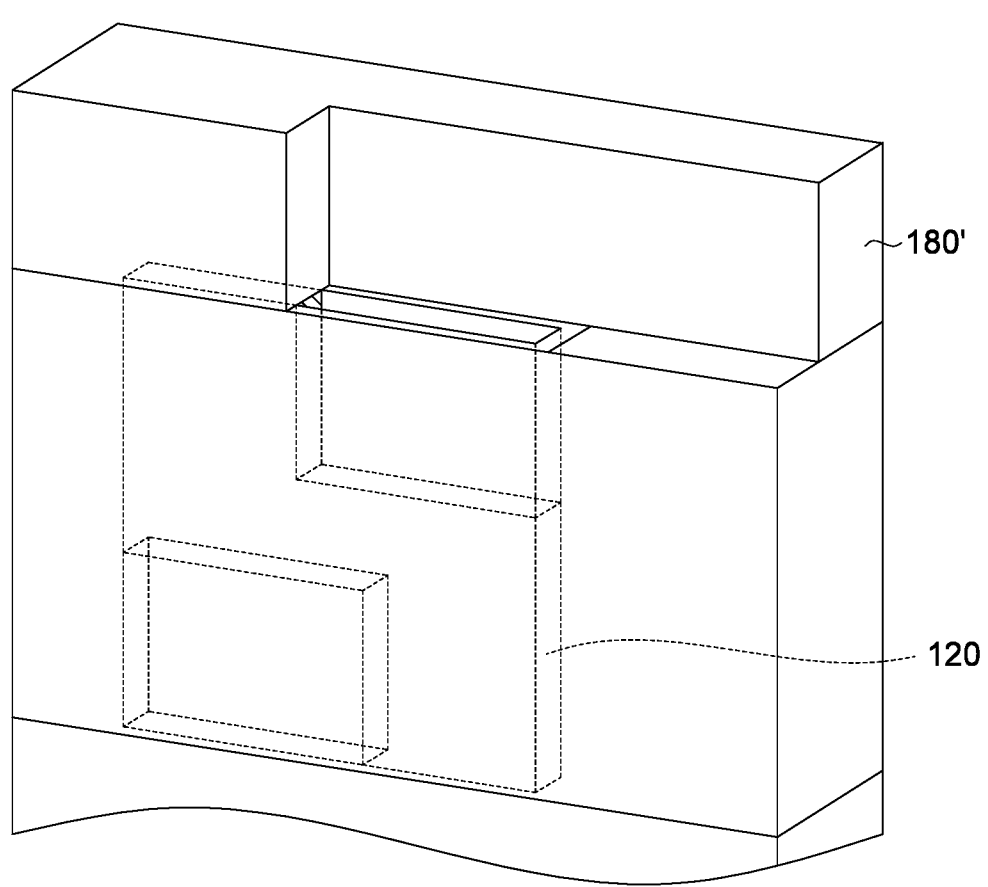

As illustrated in FIG. 21, FIG. 21 illustrates a schematic diagram of removing the photoresist PR2. In this step, the photoresist PR2 is removed from the insulation layer 180' by using, for example, etching, etc.

Figure 22:
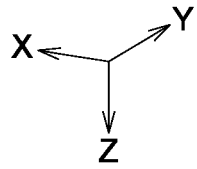
FIG. 22 illustrates a schematic diagram of removing the insulation layer.
Figure 22:
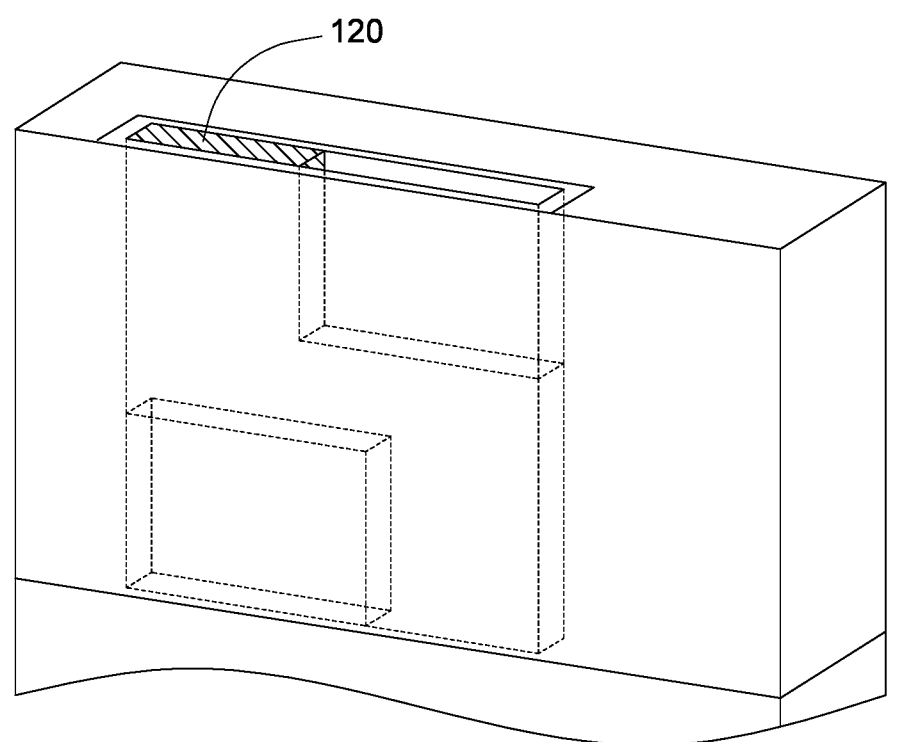

As illustrated in FIG. 22, FIG. 22 illustrates a schematic diagram of removing the insulation layer 180. In this step, the insulation layer 180' is removed to expose the vertical local interconnection 120 by using, for example, etching, etc.

Then, at least one back-side conductive segments 151 and a plurality of back-side conductive vias 161A, 161B and 161C are formed on the structure of FIG. 22. So far, the integrated circuit 100 of FIG. 1 is completed.

Referring to FIGS. 23A to 30B, FIGS. 23A to 30B illustrate schematic diagrams of manufacturing processes of the integrated circuit 200 of FIG. 9.

Figure 23A:
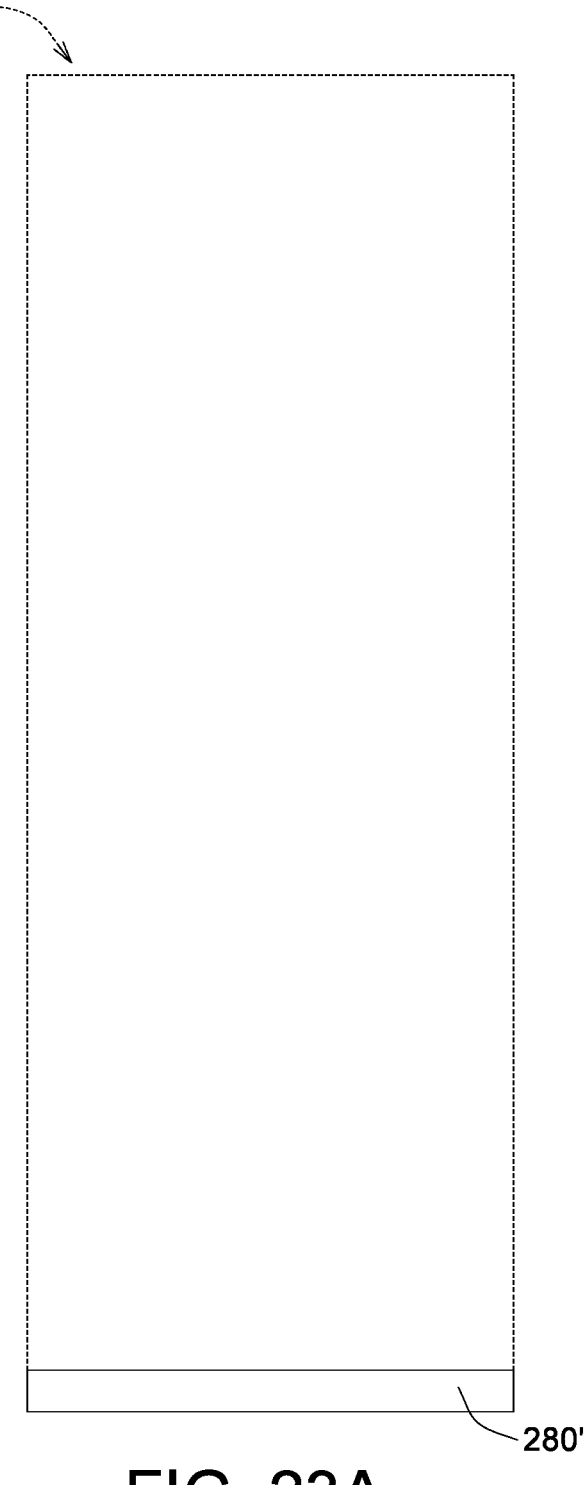
FIG. 23A illustrates a cross-sectional view, viewed in a direction 10-10 of FIG. 9, of a recess for the cut metal gate being formed.
Figure 23B:
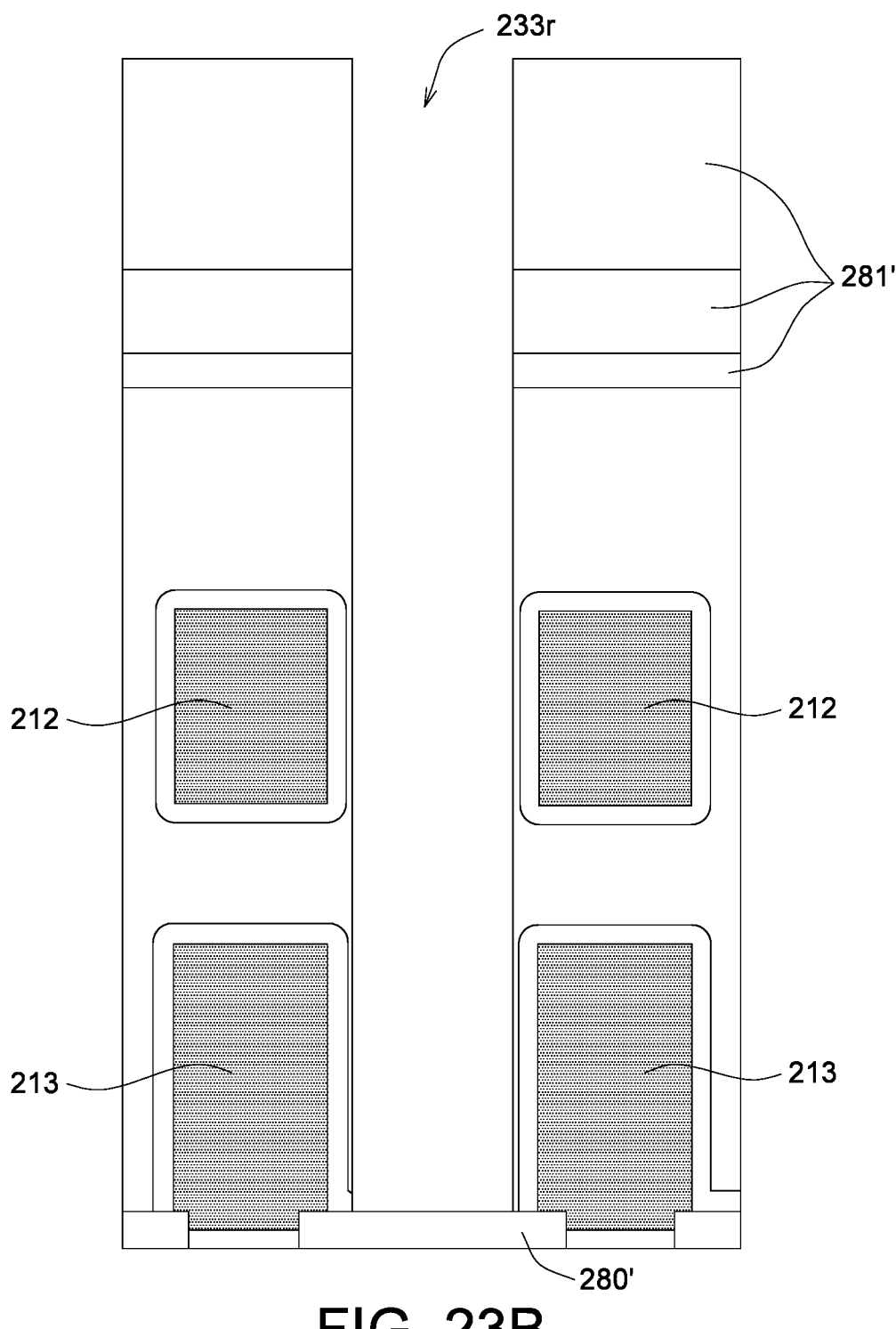
FIG. 23B illustrates a cross-sectional view, viewed in a direction 11-11 of FIG. 9.

Referring to FIGS. 23A and 23B, FIG. 23A illustrates a cross-sectional view, viewed in a direction 10-10 of FIG. 9, of a recess 233r for the cut metal gate 233 being formed, and FIG. 23B illustrates a cross-sectional view, viewed in a direction 11-11 of FIG. 9, of a recess 233r for the cut metal gate 233 being formed. In this step, a plurality of the front-side source/drain epitaxies 212 and a plurality of the back-side source/drain epitaxies 213 are formed on an insulation 280', and an insulation 281' is formed over the front-side source/drain epitaxies 212 and the back-side source/drain epitaxies 213. The recess 233r may be formed by using, for example, lithography, etching, etc. The recess 233r is, for example, a recess for a cut metal gate.

Figure 24A:
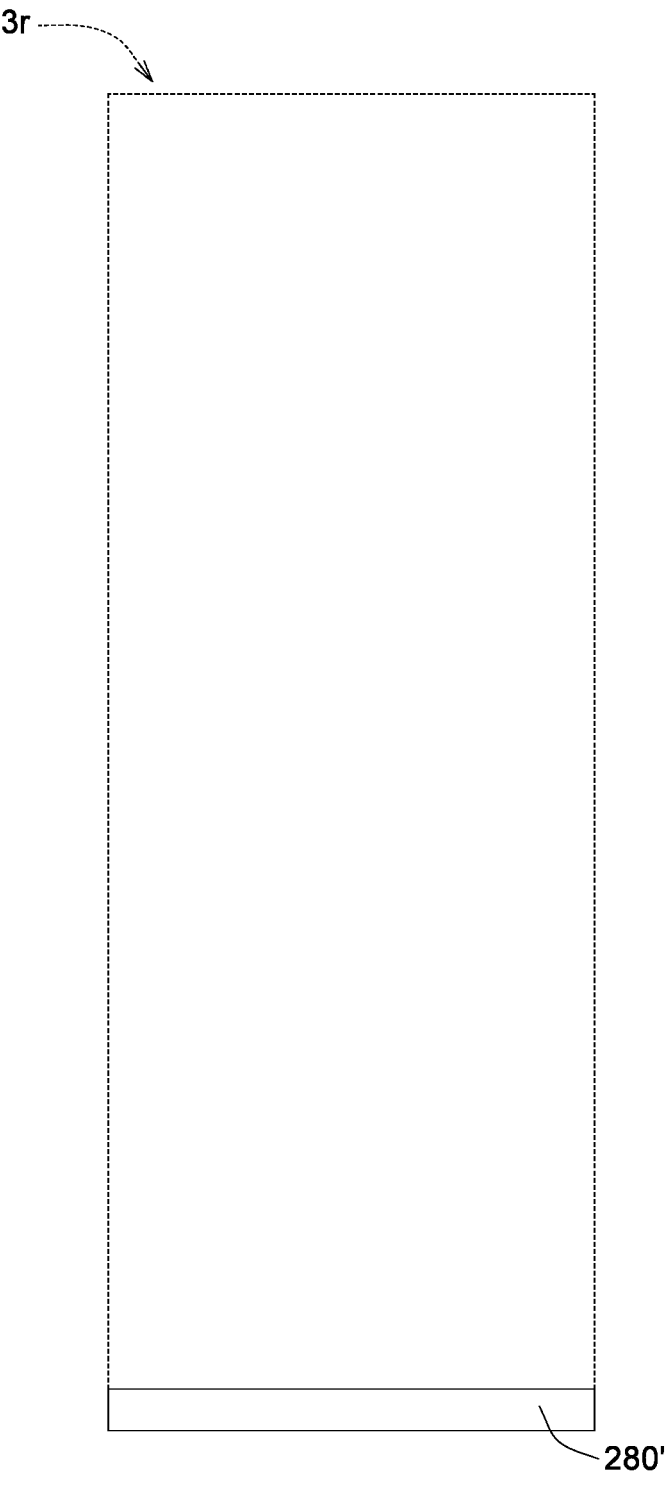
FIG. 24A illustrates a cross-sectional view, viewed in a direction 10-10 of FIG. 9, of the first dielectric sidewall 271 and the second dielectric sidewall being formed.
Figure 24B:
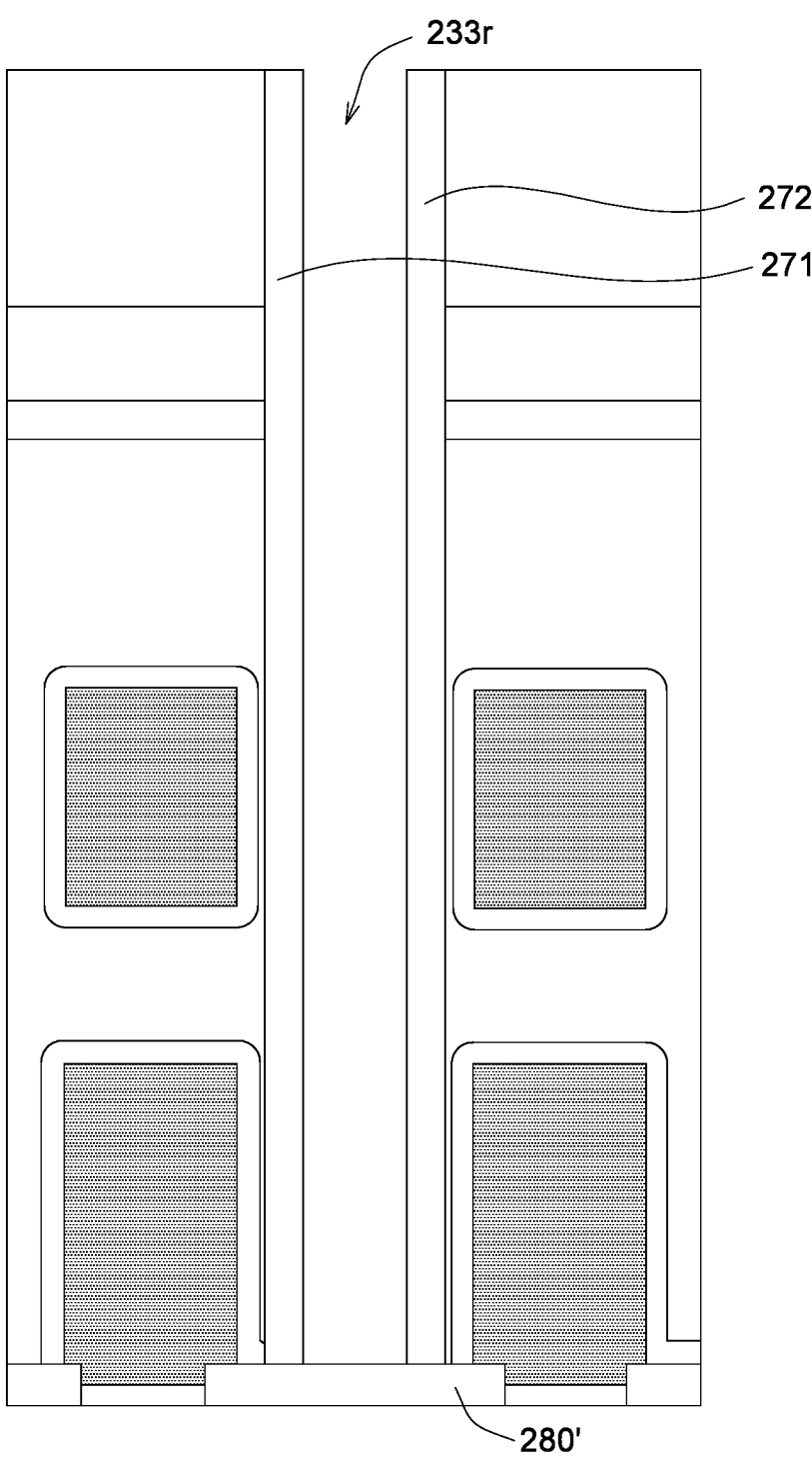
FIG. 24B illustrates a cross-sectional view, viewed in a direction 11-11 of FIG. 9.

Referring to FIGS. 24A and 24B, FIG. 24A illustrates a cross-sectional view, viewed in a direction 10-10 of FIG. 9, of the first dielectric sidewall 271 and the second dielectric sidewall 272 being formed, and FIG. 24B illustrates a cross-sectional view, viewed in a direction 11-11 of FIG. 9, of the first dielectric sidewall 271 and the second dielectric sidewall 272 being formed. In this step, the first dielectric sidewall 271 and the second dielectric sidewall 272 is formed within the recess 233r by using, for example, deposition, etching, etc. In addition, the forming method of the first dielectric sidewall 271 and the second dielectric sidewall 272 includes the processes the same as or similar to that of the first dielectric sidewall 171 and the second dielectric sidewall 172 as aforementioned, and similarities will not be repeated here.

Figure 25A:
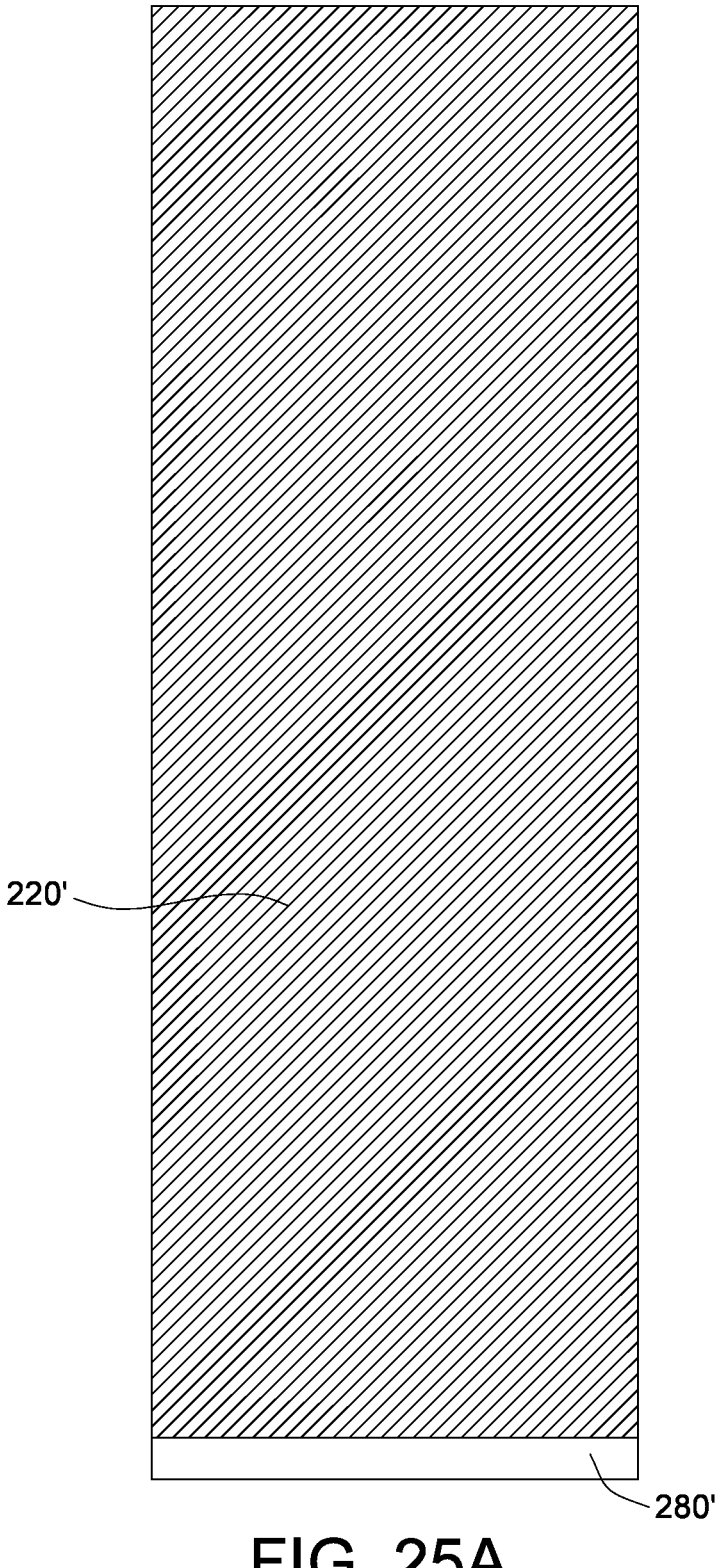
FIG. 25A illustrates a cross-sectional view, viewed in a direction 10-10 of FIG. 9, of a vertical local interconnection material being formed.
Figure 25B:
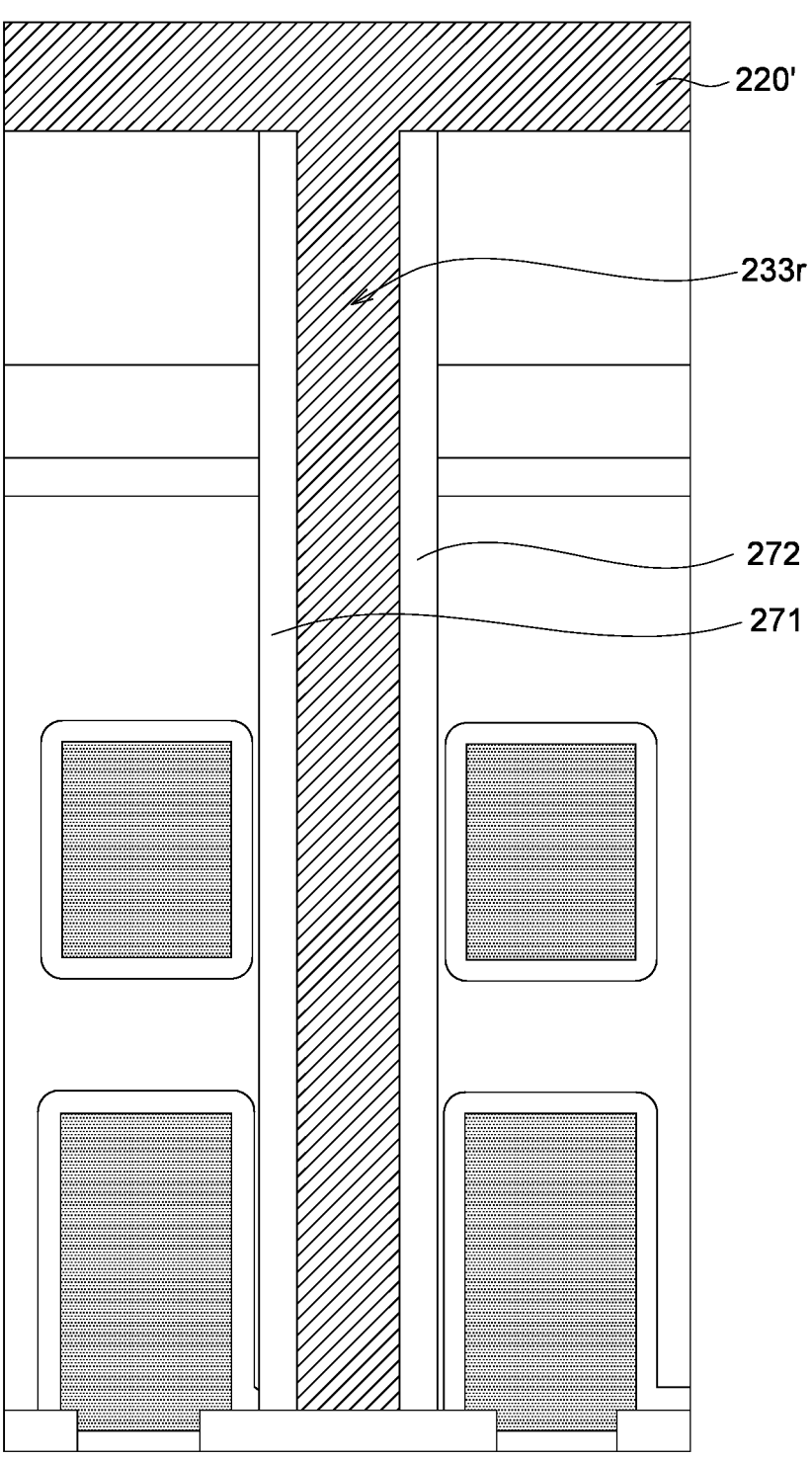
FIG. 25B illustrates a cross-sectional view, viewed in a direction 11-11 of FIG. 9.

Referring to FIGS. 25A and 25B, FIG. 25A illustrates a cross-sectional view, viewed in a direction 10-10 of FIG. 9, of a vertical local interconnection material 220' being formed, and FIG. 25B illustrates a cross-sectional view, viewed in a direction 11-11 of FIG. 9, of the vertical local interconnection material 220' being formed. In this step, the vertical local interconnection material 220' is formed within the recess 233r by using, for example, deposition, etc.

Figure 26A:
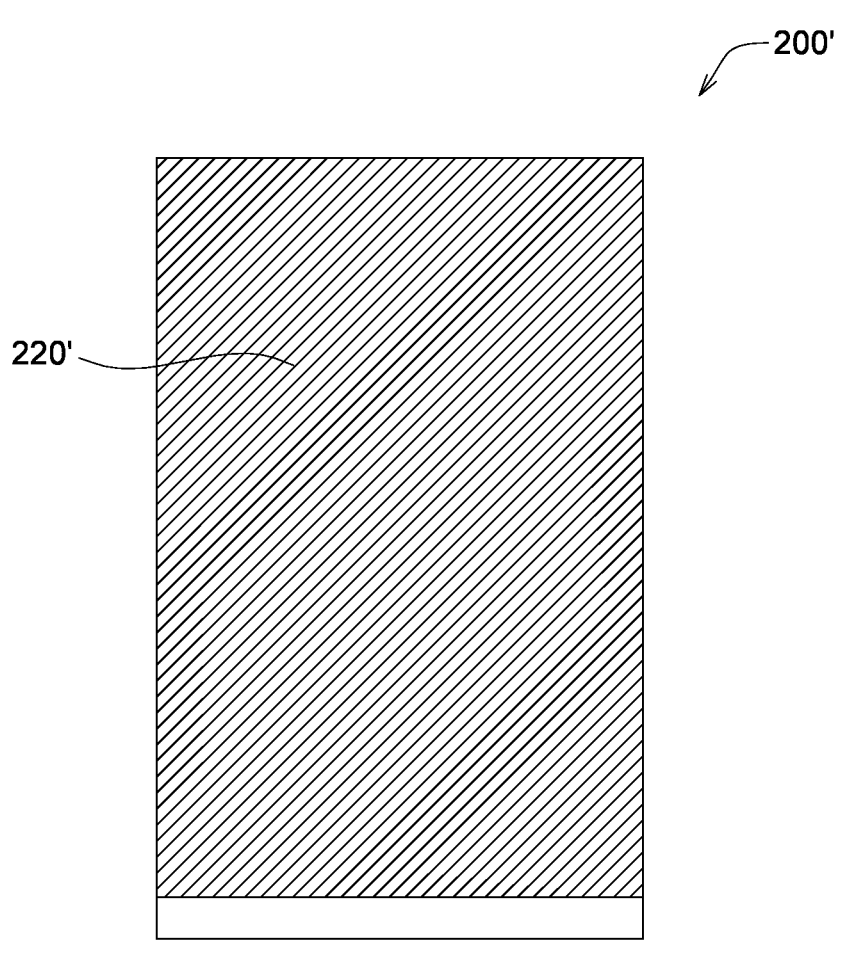
FIG. 26A illustrates a cross-sectional view, viewed in a direction 10-10 of FIG. 9, of a portion of the vertical local interconnection material being removed.
Figure 26B:
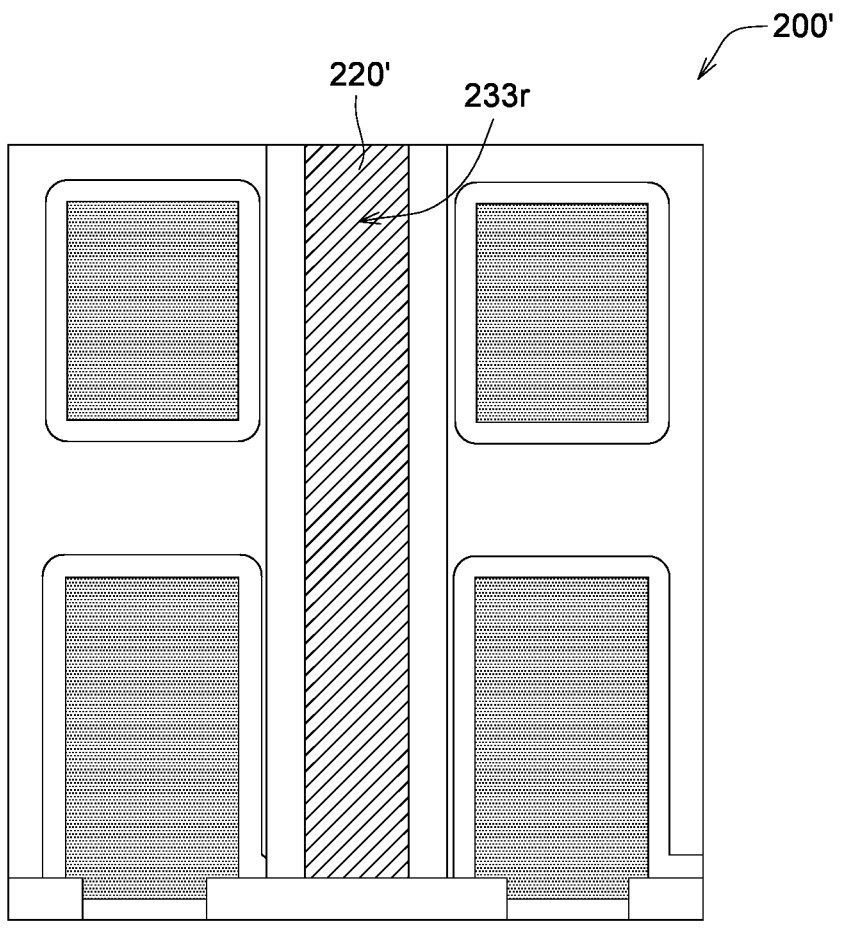
FIG. 26B illustrates a cross-sectional view, viewed in a direction 11-11 of FIG. 9, of a portion of the vertical local interconnection material being removed.

Referring to FIGS. 26A and 26B, FIG. 26A illustrates a cross-sectional view, viewed in a direction 10-10 of FIG. 9, of a portion of the vertical local interconnection material 220' being removed, and FIG. 26B illustrates a cross-sectional view, viewed in a direction 11-11 of FIG. 9, of a portion of the vertical local interconnection material 220' being removed. In this step, an insulation layer 281' of FIG. 23B, a portion of the vertical local interconnection material 220' are removed by using, for example, a CMP (Chemical Mechanical Polishing).

Figure 27A:
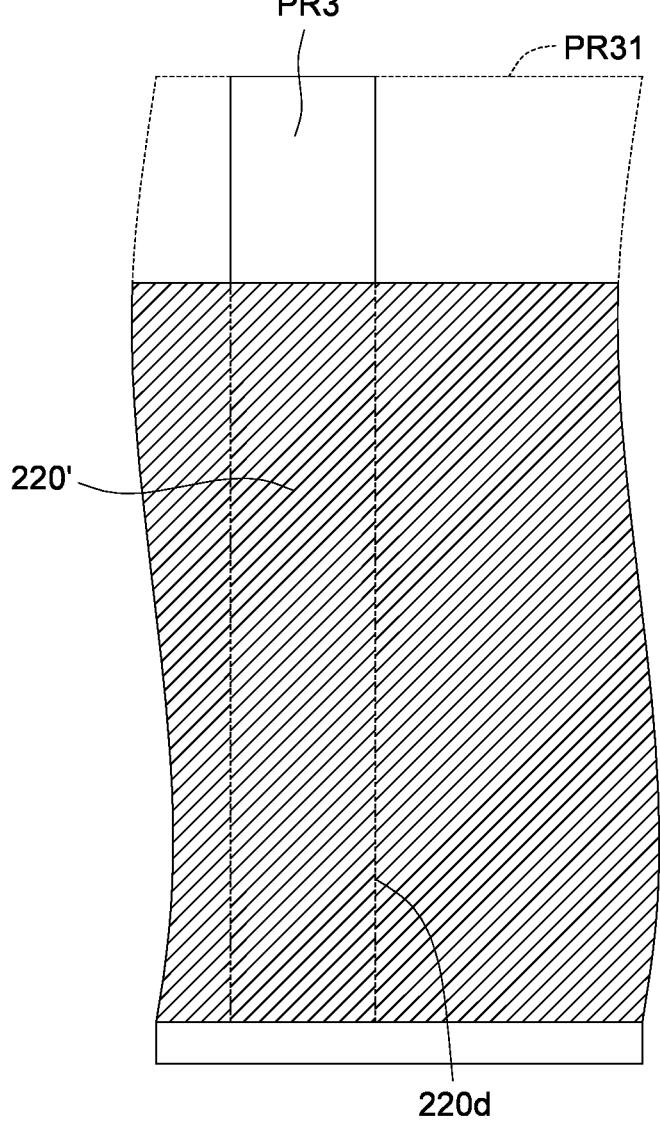
FIG. 27A illustrates a cross-sectional view, viewed in a direction 10-10 of FIG. 9, of a photoresist being formed on the structure of FIG. 26A.
Figure 27B:
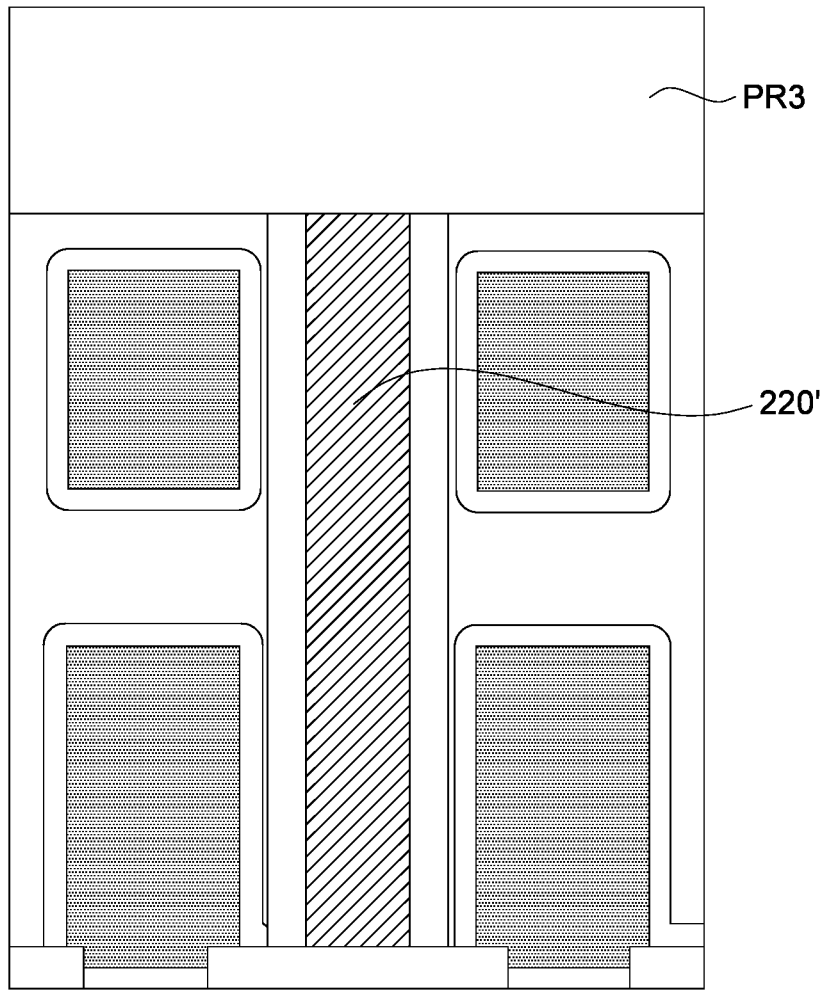
FIG. 27B illustrates a cross-sectional view, viewed in a direction 11-11 of FIG. 9, of the photoresist being formed on the structure of FIG. 26B.

Referring to FIGS. 27A and 27B, FIG. 27A illustrates a cross-sectional view, viewed in a direction 10-10 of FIG. 9, of a photoresist PR3 being formed on the structure 200' of FIG. 26A, and FIG. 27B illustrates a cross-sectional view, viewed in a direction 11-11 of FIG. 9, of the photoresist PR3 being formed on the structure 200' of FIG. 26B. In this step, the photoresist PR3 has a translucent portion PR31 exposing a region other than a defining region 220d for the subsequent vertical local interconnection 220.

Figure 28A:
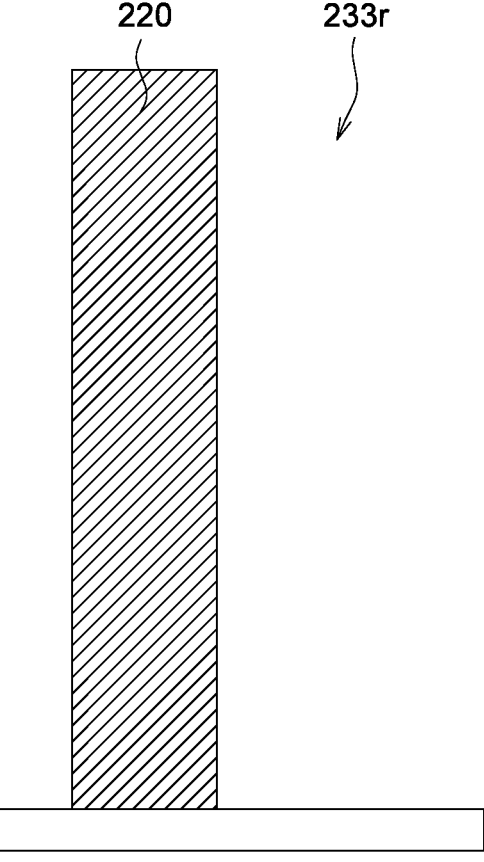
FIG. 28A illustrates a cross-sectional view, viewed in a direction 10-10 of FIG. 9, of the vertical local interconnection being formed.
Figure 28B:
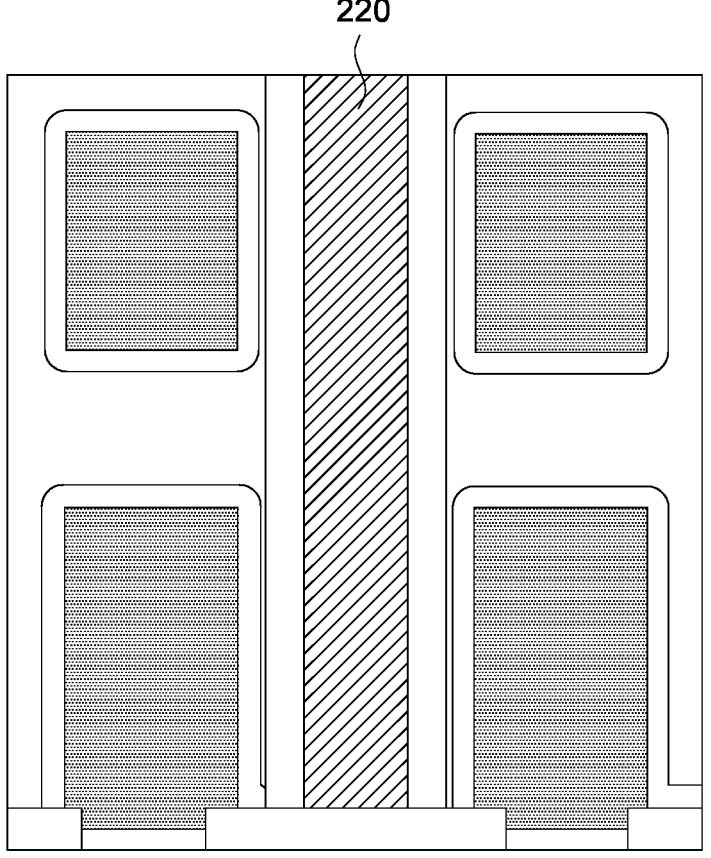
FIG. 28B illustrates a cross-sectional view, viewed in a direction 11-11 of FIG. 9, of the vertical local interconnection being formed.

Referring to FIGS. 28A and 28B, FIG. 28A illustrates a cross-sectional view, viewed in a direction 10-10 of FIG. 9, of the vertical local interconnection 220 being formed, and FIG. 28B illustrates a cross-sectional view, viewed in a direction 11-11 of FIG. 9, of the vertical local interconnection 220 being formed. In this step, a portion of the vertical local interconnection material 220' is removed to form the vertical local interconnection 220 and expose a portion of the recess 233r through the photoresist PR3 by using, for example, etching, etc.

Then, the photoresist PR3 is removed to expose the vertical local interconnection 220 and the recess 233r.

Figure 29A:
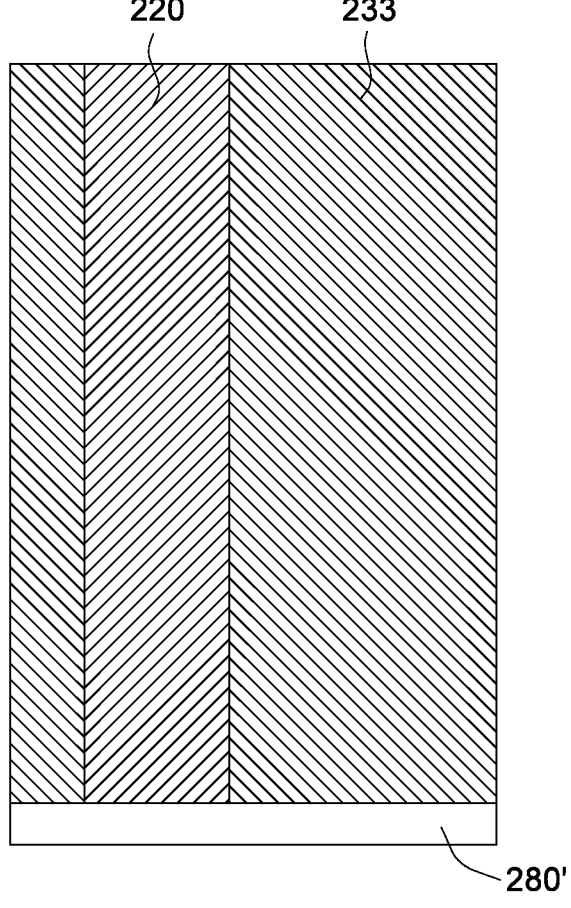
FIG. 29A illustrates a cross-sectional view, viewed in a direction 10-10 of FIG. 9, of the vertical local interconnection being formed.
Figure 29B:
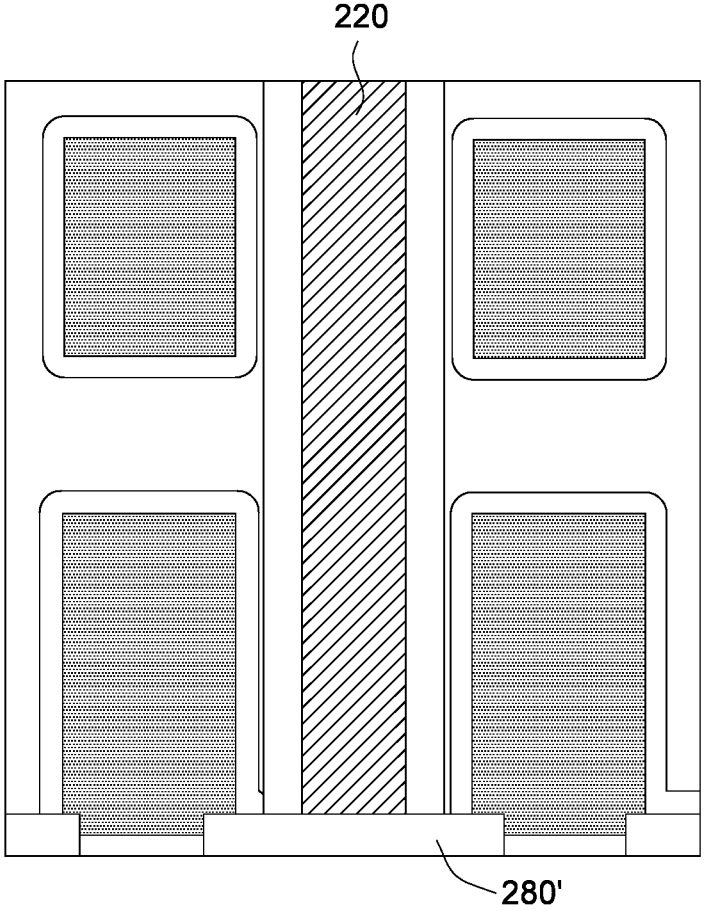
FIG. 29B illustrates a cross-sectional view, viewed in a direction 11-11 of FIG. 9, of the vertical local interconnection being formed.

Referring to FIGS. 29A and 29B, FIG. 29A illustrates a cross-sectional view, viewed in a direction 10-10 of FIG. 9, of the vertical local interconnection 220 being formed, and FIG. 29B illustrates a cross-sectional view, viewed in a direction 11-11 of FIG. 9, of the vertical local interconnection 220 being formed. In this step, the cut metal gate 233 is formed within the recess 233r by using, for example, deposition, etc.

Figure 30A:
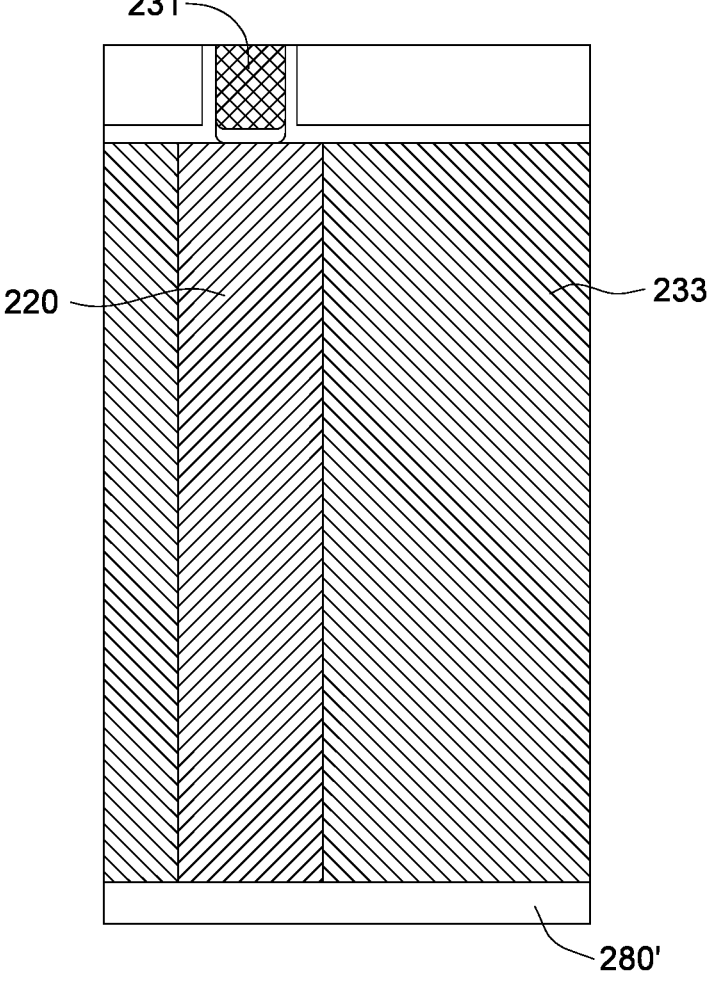
FIG. 30A illustrates a cross-sectional view, viewed in a direction 10-10 of FIG. 9, of a plurality of the conductive portions being formed.
Figure 30B:
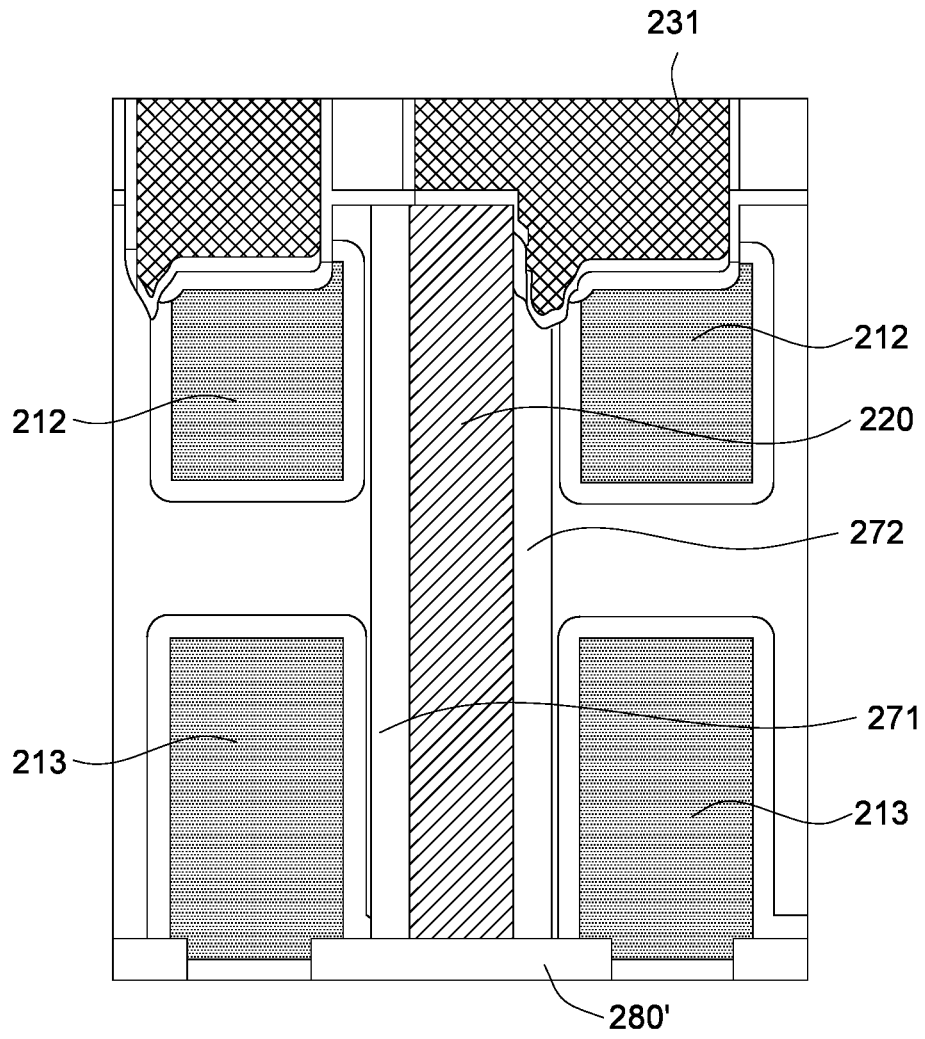
FIG. 30B illustrates a cross-sectional view, viewed in a direction 11-11 of FIG. 9, of a plurality of the conductive portions being formed.

Referring to FIGS. 30A and 30B, FIG. 30A illustrates a cross-sectional view, viewed in a direction 10-10 of FIG. 9, of a plurality of the conductive portions being formed, and FIG. 30B illustrates a cross-sectional view, viewed in a direction 11-11 of FIG. 9, of a plurality of the conductive portions being formed. In this step, at least one front-side conductive portion 231 electrically connecting the front-side source/drain epitaxies 212 and the vertical local interconnection 220 is formed by using, for example, deposition, etc.

Then, the structure of FIG. 30A may be flipped to make the insulation 280' face up. Then, the insulation 280' may be removed to expose the vertical local interconnection 220. Then, at least one back-side conductive portion 232 electrically connecting the back-side source/drain epitaxies 213 and the vertical local interconnection 220 is formed by using, for example, deposition, etc. So far, the integrated circuit 200 of FIG. 9 is completed.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

According to the present disclosure, an integrated circuit includes a plurality of front-side source/drain epitaxies, a plurality of back-side source/drain epitaxies and a vertical local interconnection. The front-side source/drain epitaxies are closer to a front-side of the integrated circuit than the back-side source/drain epitaxies. The vertical local interconnection connects a first connected-one of the front-side source/drain epitaxies with a second connected- one of the back-side source/drain epitaxies. The vertical local interconnection has a pattern to reduce an overlapping area of the vertical local interconnection overlapping a gate component, and accordingly the parasitic capacitance of gate-to-drain may be reduced.

Example embodiment 1: an integrated circuit includes a plurality of transistors and a vertical local interconnection. The transistors includes a plurality of gate components, a plurality of front-side source/drain epitaxies and a plurality of back-side source/drain epitaxies, wherein the front-side source/drain epitaxies are closer to a front-side side of the integrated circuit than the back-side source/drain epitaxies. The vertical local interconnection connects a first connected-one of the front-side source/drain epitaxies with a second connected-one of the back-side source/drain epitaxies. A covered-one of the gate components is located between the first connected-one and the second connected-one, the covered-one comprises an front-side portion, a back-side portion and a covered portion connecting the front-side portion with the back-side portion, and the vertical local interconnection crosses the covered portion and exposes the front-side portion and the back-side portion.

Example embodiment 2 based on Example embodiment 1: the first connected-one and the second connected-one are drain epitaxies.

Example embodiment 3 based on Example embodiment 1: the vertical local interconnection connects the first connected-one and the second connected-one in parallel.

Example embodiment 4 based on Example embodiment 1: the transistors comprise a N-type Metal-Oxide-Semiconductors (NMOS) and a P-type Metal-Oxide-Semiconductors (PMOS), the NMOS and the PMOS share the first connected-one, and the first connected-one is drain epitaxy.

Example embodiment 5 based on Example embodiment 1: the transistors comprise a NMOS and a PMOS, the NMOS and the PMOS share the second connected-one, and the second connected-one is drain epitaxy.

Example embodiment 6 based on Example embodiment 1: the vertical local interconnection is shaped as a Z-shape.

Example embodiment 7 based on Example embodiment 1: the vertical local interconnection comprises a first notch, a first lateral surface and a second lateral surface opposite to the first lateral surface, and the first notch extends toward a first-one of the first lateral surface and the second lateral surface from a second-one of the first lateral surface and the second lateral surface.

Example embodiment 8 based on Example embodiment 7: the vertical local interconnection further comprising a second notch, and the second notch extends toward the second-one of the first lateral surface and the second lateral surface from the first-one of the first lateral surface and the second lateral surface.

Example embodiment 9 based on Example embodiment 7: the vertical local interconnection further comprises a front-side surface and a back-side surface opposite to the front-side surface, and the first notch extends toward a third-one of the front-side surface and the back-side surface from a fourth-one of the front-side surface and the back-side surface.

Example embodiment 10 based on Example embodiment 9: the second notch extends toward the fourth-one of the front-side surface and the back-side surface from the third-one of the front-side surface and the back-side surface.

Example embodiment 11: an integrated circuit comprising a plurality of transistors and a vertical local interconnection. The transistors comprising a plurality of front-side source/drain epitaxies and a plurality of back-side source/drain epitaxies, wherein the front-side source/drain epitaxies are closer to a front-side of the integrated circuit than the back-side source/drain epitaxies. The vertical local interconnection connecting a first connected-one of the front-side source/drain epitaxies and a second connected-one of the back-side source/drain epitaxies. The vertical local interconnection has a width less than a contacted poly pitch.

Example embodiment 12 based on Example embodiment 11: the vertical local interconnection extends in single straight line.

Example embodiment 13 based on Example embodiment 11: the first connected-one and the second connected-one are opposite to each other.

Example embodiment 14 based on Example embodiment 11: the integrated circuit further comprising a first dielectric sidewall and a second dielectric sidewall, wherein the vertical local interconnection is formed between the first dielectric sidewall and the second dielectric sidewall.

Example embodiment 15 based on Example embodiment 11: the integrated circuit further comprising a cut metal gate on which the vertical local interconnection is formed.

Example embodiment 16: a manufacturing method of an integrated circuit includes the following steps: forming a plurality of transistors comprising a plurality of gate components, a plurality of front-side source/drain epitaxies and a plurality of back-side source/drain epitaxies, wherein the front-side source/drain epitaxies are closer to a front-side of the integrated circuit than the back-side source/drain epitaxies; and forming a vertical local interconnection connecting a first connected-one of the front-side source/drain epitaxies with a second connected-one of the back-side source/drain epitaxies, wherein a covered-one of the gate components is located between the first connected-one and the second connected-one, the covered-one comprises an front-side portion, a back-side portion and a covered portion connecting the front-side portion with the back-side portion, and the vertical local interconnection crosses the covered portion and exposes the front-side portion and the back-side portion.

Example embodiment 17 based on Example embodiment 16: the manufacturing method further includes: forming a recess on a dielectric layer; and forming a vertical local interconnection material within the recess.

Example embodiment 18 based on Example embodiment 17: the manufacturing method further includes: forming a first notch on the vertical local interconnection material from the front-side; and forming a second notch on the vertical local interconnection material from a back-side of the integrated circuit.

Example embodiment 19 based on Example embodiment 17: the vertical local interconnection material has a first lateral surface, a second lateral surface opposite to the first lateral surface, a front-side surface and a back-side surface opposite to the front-side surface; the manufacturing method further includes forming a first notch on the vertical local interconnection material. The first notch extends toward a first-one of the first lateral surface and the second lateral surface from a second-one of the first lateral surface and the second lateral surface, and extends toward a third-one of the front-side surface and the back-side surface from a fourth-one of the front-side surface and the back-side surface.

Example embodiment 20 based on Example embodiment 19: the manufacturing method further includes forming a second notch on the vertical local interconnection material. The second notch extends toward the second-one of the first lateral surface and the second lateral surface from the first-one of the first lateral surface and the second lateral surface, and extends toward the fourth-one of the front-side surface and the back-side surface from the third-one of the front-side surface and the back-side surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
   a plurality of transistors comprising a plurality of gate components, a plurality of front-side source/drain epitaxies and a plurality of back-side source/drain epitaxies, wherein the front-side source/drain epitaxies are closer to a front-side side of the integrated circuit than the back-side source/drain epitaxies; and
   a vertical local interconnection connecting a first connected-one of the front-side source/drain epitaxies with a second connected-one of the back-side source/drain epitaxies;
   wherein a covered-one of the gate components is located between the first connected-one and the second connected-one, the covered-one comprises an front-side portion, a back-side portion and a covered portion connecting the front-side portion with the back-side portion, and the vertical local interconnection crosses the covered portion and exposes the front-side portion and the back-side portion;
   wherein the vertical local interconnection comprises a first notch, a first lateral surface and a second lateral surface opposite to the first lateral surface, and the first notch extends toward a first-one of the first lateral surface and the second lateral surface from a second-one of the first lateral surface and the second lateral surface.

2. The integrated circuit as claimed in claim 1, wherein the first connected-one and the second connected-one are drain epitaxies.

3. The integrated circuit as claimed in claim 1, wherein the vertical local interconnection connects the first connected-one and the second connected-one in parallel.

4. The integrated circuit as claimed in claim 1, wherein the transistors comprise a N-type Metal-Oxide-Semiconductors (NMOS) and a P-type Metal-Oxide- Semiconductors (PMOS), the NMOS and the PMOS share the first connected-one, and the first connected-one is drain epitaxy.

5. The integrated circuit as claimed in claim 1, wherein the transistors comprise a NMOS and a PMOS, the NMOS and the PMOS share the second connected-one, and the second connected-one is drain epitaxy.

6. The integrated circuit as claimed in claim 1, wherein the vertical local interconnection is shaped as a Z-shape.

7. The integrated circuit as claimed in claim 1, wherein the vertical local interconnection further comprising a second notch, and the second notch extends toward the second-one of the first lateral surface and the second lateral surface from the first-one of the first lateral surface and the second lateral surface.

8. The integrated circuit as claimed in claim 1, wherein the vertical local interconnection further comprises a front-side surface and a back-side surface opposite to the front-side surface, and the first notch extends toward a third-one of the front-side surface and the back-side surface from a fourth-one of the front-side surface and the back-side surface.

9. The integrated circuit as claimed in claim 8, wherein the vertical local interconnection further comprising a second notch, and the second notch extends toward the fourth-one of the front-side surface and the back-side surface from the third-one of the front-side surface and the back-side surface.

10. An integrated circuit, comprising:
    a plurality of transistors comprising a plurality of front-side source/drain epitaxies and a plurality of back-side source/drain epitaxies, wherein the front-side source/ drain epitaxies are closer to a front-side of the integrated circuit than the back-side source/drain epitaxies; and a vertical local interconnection connecting a first connected-one of the front-side source/drain epitaxies and a second connected-one of the back-side source/drain epitaxies;

wherein the vertical local interconnection has a width less than a contacted poly pitch (CPP);

wherein the vertical local interconnection comprises a first notch, a first lateral surface and a second lateral surface opposite to the first lateral surface, and the first notch extends toward a first-one of the first lateral surface and the second lateral surface from a second-one of the first lateral surface and the second lateral surface.

11. The integrated circuit as claimed in claim 10, wherein the vertical local interconnection extends in single straight line.

12. The integrated circuit as claimed in claim 10, wherein the first connected- one and the second connected-one are opposite to each other.

13. The integrated circuit as claimed in claim 10, further comprising:

a first dielectric sidewall; and a second dielectric sidewall;

wherein the vertical local interconnection is formed between the first dielectric sidewall and the second dielectric sidewall.

14. The integrated circuit as claimed in claim 10, further comprising:

a cut metal gate on which the vertical local interconnection is formed.

15. The integrated circuit as claimed in claim 10, wherein the vertical local interconnection further comprises a second notch, and the second notch extends toward the second-one of the first lateral surface and the second lateral surface from the first-one of the first lateral surface and the second lateral surface.

16. The integrated circuit as claimed in claim 10, wherein the vertical local interconnection further comprises a front-side surface and a back-side surface opposite to the front-side surface, and the first notch extends toward a third-one of the front-side surface and the back-side surface from a fourth-one of the front-side surface and the back-side surface.

17. A manufacturing method of an integrated circuit, comprising:

forming a plurality of transistors comprising a plurality of gate components, a plurality of front-side source/drain epitaxies and a plurality of back-side source/drain epitaxies, wherein the front-side source/drain epitaxies are closer to a front-side side of the integrated circuit than the back-side source/drain epitaxies; and forming a vertical local interconnection connecting a first connected-one of the front-side source/drain epitaxies with a second connected-one of the back-side source/drain epitaxies, wherein a covered-one of the gate components is located between the first connected-one and the second connected-one, the covered-one comprises an front-side portion, a back-side portion and a covered portion connecting the front-side portion with the back-side portion, and the vertical local interconnection crosses the covered portion and exposes the front-side portion and the back-side portion;

wherein the manufacturing method further comprises:

forming a first notch on a vertical local interconnection material which is formed in the integrated circuit from the front-side; and forming a second notch on the vertical local interconnection material from a back-side of the integrated circuit.

18. The manufacturing method as claimed in claim 17, further comprising:

forming a recess on a dielectric layer; and forming the vertical local interconnection material within the recess.

19. The manufacturing method as claimed in claim 18, wherein the vertical local interconnection material has a first lateral surface, a second lateral surface opposite to the first lateral surface, a front-side surface and a back-side surface opposite to the front-side surface; the manufacturing method further comprising:

wherein the first notch extends toward a first-one of the first lateral surface and the second lateral surface from a second-one of the first lateral surface and the second lateral surface, and extends toward a third-one of the front-side surface and the back-side surface from a fourth-one of the front-side surface and the back-side surface.

20. The manufacturing method as claimed in claim 19, further comprising:

wherein the second notch extends toward the second-one of the first lateral surface and the second lateral surface from the first-one of the first lateral surface and the second lateral surface, and extends toward the fourth-one of the front-side surface and the back-side surface from the third-one of the front-side surface and the back-side surface.

* * * * *